(12) United States Patent
 Butler et al.

(10) Patent No.: US 9,813,085 B1
(45) Date of Patent: Nov. 7, 2017

(54) CLOSED LOOP DIGITAL PRE-DISTORTION

(71) Applicant: QUALCOMM Incorporated, San Diego, CA (US)

(72) Inventors: Paul Brandon Butler, San Jose, CA (US); James Gardner, San Ramon, CA (US); Niranjan Talwalkar, San Jose, CA (US); Burcin Baytekin, Milpitas, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/275,317

(22) Filed: Sep. 23, 2016

(51) Int. Cl.
*H04B 1/04* (2006.01)
*H04B 7/0413* (2017.01)
*H04B 17/13* (2015.01)
*H04B 7/06* (2006.01)
*H04L 5/22* (2006.01)

(52) U.S. Cl.
CPC ......... *H04B 1/0458* (2013.01); *H04B 1/0475* (2013.01); *H04B 7/0413* (2013.01); *H04B 7/0626* (2013.01); *H04B 17/13* (2015.01); *H04L 5/22* (2013.01)

(58) Field of Classification Search
CPC .... H04B 1/0458; H04B 7/0413; H04B 17/13; H04B 7/0626; H04B 1/0475; H04L 5/22
See application file for complete search history.

(56) References Cited

U.S. PATENT DOCUMENTS

| | | | |
|---|---|---|---|
| 6,255,906 B1 | 7/2001 | Eidson et al. | |
| 6,496,062 B1* | 12/2002 | Nitz | H03F 1/3247 330/136 |
| 6,606,483 B1* | 8/2003 | Baker | H03F 1/0277 455/126 |
| 7,412,215 B1* | 8/2008 | Hietala | H03L 7/081 375/294 |
| 8,995,936 B2* | 3/2015 | Desclos | H04B 1/0475 375/296 |
| 2001/0050592 A1 | 12/2001 | Wright et al. | |
| 2002/0136324 A1* | 9/2002 | Nagasaka | H03F 1/3294 375/296 |
| 2002/0186783 A1 | 12/2002 | Opas et al. | |
| 2004/0246048 A1* | 12/2004 | Leyonhjelm | H03F 1/3247 330/2 |
| 2009/0207896 A1* | 8/2009 | Behzad | H04B 1/0475 375/221 |
| 2012/0002752 A1* | 1/2012 | Coan | H03F 1/3247 375/297 |

(Continued)

*Primary Examiner* — Kenneth Lam
(74) *Attorney, Agent, or Firm* — Paradice and Li LLP/Qualcomm

(57) ABSTRACT

A system and method for calibrating digital pre-distortion in a wireless device. A pre-distortion circuit may output a first training signal while a power amplifier of the wireless device is on, to generate a first feedback signal. The first feedback signal may be fed back to the pre-distortion circuit via a receive path of the wireless device. The pre-distortion circuit may output a second training signal while the power amplifier is off, to generate a second feedback signal. The second feedback signal may be fed back to the pre-distortion circuit via the receive path. The pre-distortion circuit may then determine one or more pre-distortion coefficients based on the first and second feedback signals.

21 Claims, 10 Drawing Sheets

(56) References Cited

U.S. PATENT DOCUMENTS

| | | | |
|---|---|---|---|
| 2012/0155572 A1* | 6/2012 | Kim | H03F 1/3247 375/297 |
| 2012/0321018 A1 | 12/2012 | Chen et al. | |
| 2013/0257529 A1* | 10/2013 | Komninakis | H03F 1/0244 330/149 |
| 2014/0036973 A1 | 2/2014 | Au et al. | |
| 2014/0232468 A1* | 8/2014 | Hulbert | H04B 1/0475 330/293 |
| 2016/0344483 A1* | 11/2016 | Kareisto | H04B 17/12 |

* cited by examiner

CLOSED LOOP DIGITAL PRE-DISTORTION

TECHNICAL FIELD

The present disclosure relates generally to communication systems, and specifically to pre-distortion techniques in wireless devices.

BACKGROUND

Transmitting high power signals using wireless transceivers may be challenging due to the inherent non-linear characteristics of power amplifiers provided within the transceivers. Indeed, power amplifiers typically have a limited linear region of operation for which their operating characteristics are predictable. For example, if the operating temperature and/or power level of a power amplifier falls outside a specified range, the power amplifier may begin operating in a non-linear manner that undesirably distorts data signals being amplified for transmission. The resulting signal distortion may cause data errors in the received data, and may overload (or even damage) front-end circuitry associated with the transceiver of the transmitting device. To compensate for the non-linear characteristics of the power amplifier, digital pre-distortion techniques may be applied to maintain signal power levels within certain ranges (e.g., by adjusting the gain of the power amplifier).

Many wireless devices include a loopback path that routes signals output from the power amplifier as feedback signals to a pre-distortion circuit, which in turn may process the feedback signals to determine a set of pre-distortion coefficients that represents the behavior of the power amplifier. The pre-distortion coefficients may be used to calibrate the power amplifier, for example, by pre-distorting data signals prior to amplification by the power amplifier.

Including a dedicated loopback path to route the feedback signals to the pre-distortion circuit may undesirably increase circuit area, especially for wireless devices that include multiple transceiver chains. In addition, the feedback signals may undesirably include parasitics of transmit and/or receive paths associated with the transceiver, which in turn may result in inaccurate pre-distortion coefficients.

Thus, it would be desirable to determine pre-distortion coefficients uncorrupted by transmit and/or receive path parasitics and without using dedicated loopback paths.

SUMMARY

This Summary is provided to introduce in a simplified form a selection of concepts that are further described below in the Detailed Description. This summary is not intended to identify key features or essential features of the claimed subject matter, nor is it intended to limit the scope of the claimed subject matter.

Apparatuses and methods for digital pre-distortion techniques are disclosed herein. In one aspect, an apparatus for wireless communication is disclosed. The apparatus may include a power amplifier coupled to a transmit path of the apparatus; a switch to selectively couple an output of the power amplifier to a receive path of the apparatus; and a pre-distortion circuit coupled to an input of the power amplifier by the transmit path and coupled to the switch by the receive path. If the power amplifier is on, the pre-distortion circuit may be configured to output, on the transmit path, a first signal; and receive, via the receive path, a first feedback signal generated based on the first signal. If the power amplifier is off, the pre-distortion circuit may be configured to output, on the transmit path, a second signal; and receive, via the receive path, a second feedback signal generated based on the second signal. The pre-distortion circuit may be further configured to determine one or more coefficients based at least in part on the first and second feedback signals; and apply the one or more coefficients to a data signal to generate a third signal.

In another aspect, a method for wireless communication is disclosed. The method may include selectively coupling an output of a power amplifier, provided along a transmit path of an apparatus, to a receive path of the apparatus; if the power amplifier is on: outputting, on the transmit path, a first signal; and receiving, via the receive path, a first feedback signal generated based on the first signal; if the power amplifier is off: outputting, on the transmit path, a second signal; and receiving, via the receive path, a second feedback signal generated based on the second signal; determining one or more coefficients based at least in part on the first and second feedback signals; and applying the one or more coefficients to a data signal to generate a third signal.

In another aspect, an apparatus for wireless communication is disclosed. The apparatus may include means for selectively coupling an output of a power amplifier, provided along a transmit path of the apparatus, to a receive path of the apparatus; if the power amplifier is on: means for outputting, on the transmit path, a first signal; and means for receiving, via the receive path, a first feedback signal generated based on the first signal; if the power amplifier is off: means for outputting, on the transmit path, a second signal; and means for receiving, via the receive path, a second feedback signal generated based on the second signal; means for determining one or more coefficients based on the first and second feedback signals; and means for applying the one or more coefficients to generate a third signal.

In another aspect, a computer-readable medium is disclosed. The computer-readable medium may comprise instructions that, when executed by an apparatus, cause the apparatus to selectively couple an output of a power amplifier, provided along a transmit path of the apparatus, to a receive path of the apparatus; if the power amplifier is on: output, on the transmit path, a first signal; and receive, via the receive path, a first feedback signal generated based on the first signal; if the power amplifier is off: output, on the transmit path, a second signal; and receive, via the receive path, a second feedback signal generated based on the second signal; determine one or more coefficients based at least in part on the first and second feedback signals; and apply the one or more coefficients to a data signal to generate a third signal.

In another aspect, a wireless node is disclosed. The wireless node may include at least one antenna and a processing system. The at least one antenna may be coupled to a transmit path and a receive path of the wireless node. The processing system may be configured to selectively couple an output of a power amplifier, provided along a transmit path of the wireless node, to a receive path of the wireless node; if the power amplifier is on: output, on the transmit path, a first signal; and receive, via the receive path, a first feedback signal generated based on the first signal; if the power amplifier is off: output, on the transmit path, a second signal; and receive, via the receive path, a second feedback signal generated based on the second signal; determine one or more coefficients based at least in part on the first and second feedback signals; and apply the one or more coefficients to a data signal to generate a third signal.

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purpose of illustration and description only, and not as a definition of the limits of the claims.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

Figure 1:
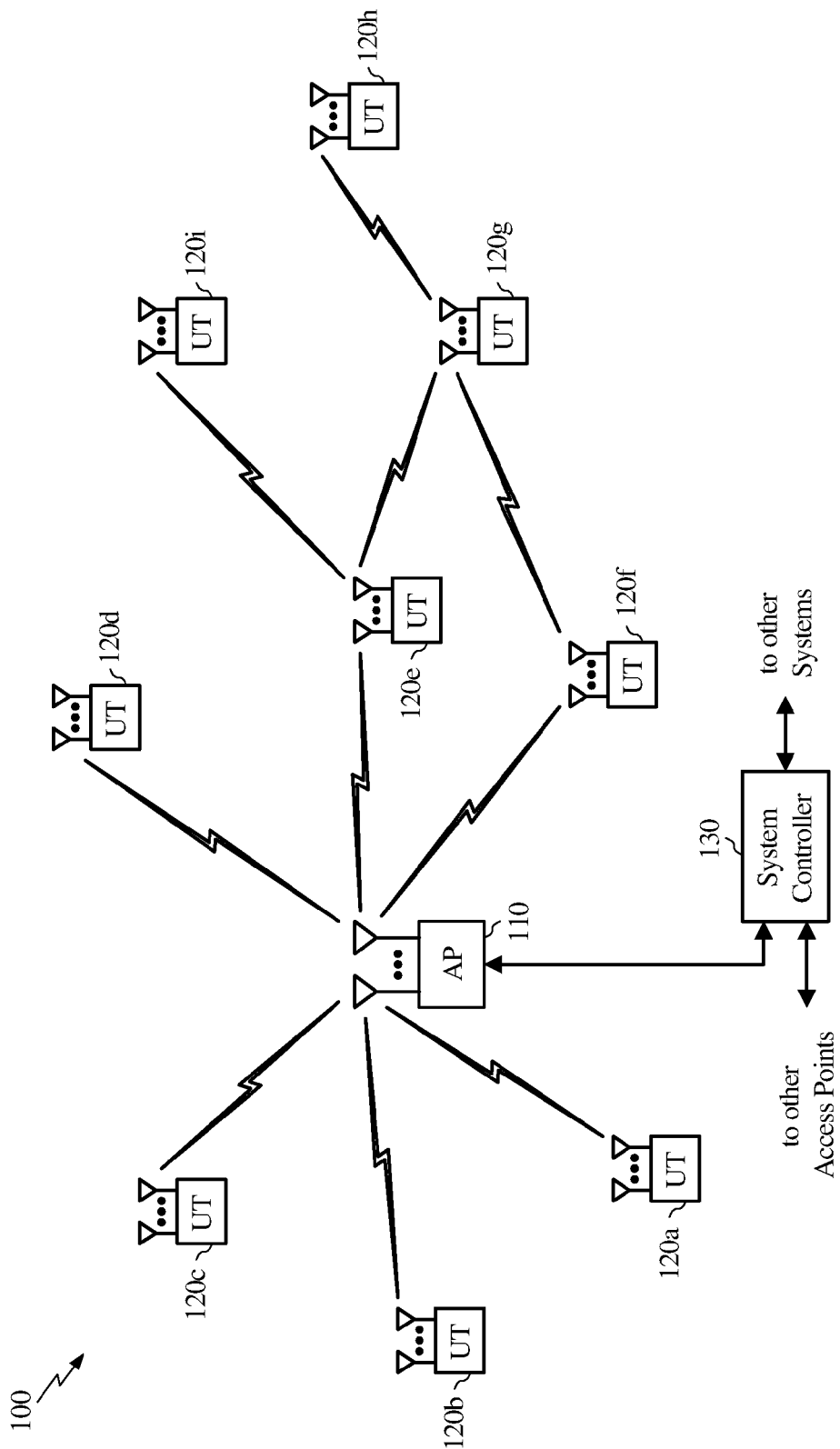
FIG. 1 shows a block diagram of a multiple-input multiple-output (MIMO) wireless system within which various aspects of the present disclosure may be implemented.

Aspects of the present disclosure may assist in calibrating digital pre-distortion in a wireless device. In some aspects, the wireless device may include at least a transmit path, a receive path, a power amplifier, a switch, and a pre-distortion circuit. The pre-distortion circuit may include an output terminal coupled to the transmit path, and may include an input terminal coupled to the receive path. The transmit path may provide signals output from the pre-distortion circuit to the power amplifier for amplification prior to transmission from the wireless device. The receive path may provide signals received from other devices to the pre-distortion circuit. The switch may selectively couple an output terminal of the power amplifier to the receive path, for example, to provide a feedback path between the power amplifier and the pre-distortion circuit along the receive path. In this manner, a separate or dedicated feedback path between the power amplifier and the pre-distortion circuit is not needed.

While the power amplifier is on, the pre-distortion circuit may output a first signal on the transmit path to the power amplifier. The power amplifier may amplify the first signal, which may then be provided as a first feedback signal to the pre-distortion circuit via the receive path. The first feedback signal may include non-linear characteristics of the power amplifier as well as parasitics of the transmit path and/or the receive path. While the power amplifier is off, the pre-distortion circuit may output a second signal on the transmit path to the power amplifier. The power amplifier may pass the second signal, which may then be provided as a second feedback signal to the pre-distortion circuit via the receive path. The second feedback signal may include parasitics of the transmit path and/or the receive path but not the non-linear characteristics of the power amplifier. The pre-distortion circuit may determine one or more pre-distortion coefficients based on the first and second feedback signals, and then apply the one or more pre-distortion coefficients to a data signal to generate a pre-distorted data signal. The pre-distorted data signal may be amplified and then transmitted to one or more other devices.

Aspects of the present disclosure may be described below in the context of wireless local area network (WLAN) systems for simplicity only. It is to be understood that aspects of the present disclosure are equally applicable to other wireless networks (e.g., cellular networks, pico networks, femto networks, satellite networks), as well as for systems using signals of one or more wired standards or protocols (e.g., Ethernet and/or HomePlug/PLC standards). As used herein, the terms "WLAN" and "Wi-Fi®" may include communications governed by the IEEE 802.11 family of standards, Bluetooth®, HiperLAN (a set of wireless standards, comparable to the IEEE 802.11 standards, used primarily in Europe), and other technologies having relatively short radio propagation range. Thus, the terms "WLAN" and "Wi-Fi®" may be used interchangeably herein.

In the following description, numerous specific details are set forth such as examples of specific components, circuits, and processes to provide a thorough understanding of the present disclosure. The term "coupled" as used herein means connected directly to or connected through one or more intervening components or circuits. The term "characteristics" as used herein may refer to one or more operating characteristics, parameters, or properties of a power amplifier including, for example, non-linear characteristics of the power amplifier. Also, in the following description and for purposes of explanation, specific nomenclature is set forth to provide a thorough understanding of the present disclosure. However, it will be apparent to one skilled in the art that these specific details may not be required to practice the example implementations. In other instances, well-known circuits and devices are shown in block diagram form to avoid obscuring the present disclosure. The present disclosure is not to be construed as limited to specific examples described herein but rather to include within their scopes all implementations defined by the appended claims.

Various aspects of the disclosure are described more fully hereinafter with reference to the accompanying drawings. This disclosure may, however, be embodied in many different forms and should not be construed as limited to any specific structure or function presented throughout this disclosure. Rather, these aspects are provided so that this disclosure will be thorough and complete, and will fully convey the scope of the disclosure to those skilled in the art. Based on the teachings herein one skilled in the art should appreciate that the scope of the disclosure is intended to cover any aspect of the disclosure disclosed herein, whether implemented independently of or combined with any other aspect of the disclosure. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in other examples.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "accessing," "receiving," "sending," "using," "selecting," "determining," "normalizing," "multiplying," "averaging," "monitoring," "comparing," "applying," "updating," "measuring," "deriving" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

In the figures, a single block may be described as performing a function or functions; however, in actual practice, the function or functions performed by that block may be performed in a single component or across multiple components, and/or may be performed using hardware, using software, or using a combination of hardware and software. To clearly illustrate this interchangeability of hardware and software, various illustrative components, blocks, modules, circuits, and steps are described below generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the claims. Also, the example wireless communications devices may include components other than those shown.

The techniques described herein may be used for various broadband wireless communication systems, including communication systems that are based on an orthogonal multiplexing scheme. Examples of such communication systems include Spatial Division Multiple Access (SDMA), Time Division Multiple Access (TDMA), Orthogonal Frequency Division Multiple Access (OFDMA) systems, Single-Carrier Frequency Division Multiple Access (SC-FDMA) systems, and so forth. An SDMA system may utilize sufficiently different directions to simultaneously transmit data belonging to multiple user terminals. A TDMA system may allow multiple user terminals to share the same frequency channel by dividing the transmission signal into different time slots, each time slot being assigned to different user terminal. An OFDMA system utilizes orthogonal frequency division multiplexing (OFDM), which is a modulation technique that partitions the overall system bandwidth into multiple orthogonal sub-carriers. These sub-carriers may also be called tones, bins, etc. With OFDM, each sub-carrier may be independently modulated with data. An SC-FDMA system may utilize interleaved FDMA (IFDMA) to transmit on sub-carriers that are distributed across the system bandwidth, localized FDMA (LFDMA) to transmit on a block of adjacent sub-carriers, or enhanced FDMA (EFDMA) to transmit on multiple blocks of adjacent sub-carriers. In general, modulation symbols are sent in the frequency domain with OFDM and in the time domain with SC-FDMA.

The teachings herein may be incorporated into (e.g., implemented within or performed by) a variety of wired or wireless apparatuses (e.g., nodes). In some aspects, a wireless node implemented in accordance with the teachings herein may comprise an access point or an access terminal.

An Example Wireless Communication System

An access point ("AP") may comprise, be implemented as, or known as a Node B, Radio Network Controller ("RNC"), evolved Node B (eNB), Base Station Controller ("BSC"), Base Transceiver Station ("BTS"), Base Station ("BS"), Transceiver Function ("TF"), Radio Router, Radio Transceiver, Basic Service Set ("BSS"), Extended Service Set ("ESS"), Radio Base Station ("RBS"), or some other terminology.

An access terminal ("AT") may comprise, be implemented as, or known as a subscriber station, a subscriber unit, a mobile station (MS), a remote station, a remote terminal, a user terminal (UT), a user agent, a user device, user equipment (UE), a user station, or some other terminology. In some implementations, an access terminal may comprise a cellular telephone, a cordless telephone, a Session Initiation Protocol ("SIP") phone, a wireless local loop ("WLL") station, a personal digital assistant ("PDA"), a handheld device having wireless connection capability, a Station ("STA"), or some other suitable processing device connected to a wireless modem. Accordingly, one or more aspects taught herein may be incorporated into a phone (e.g., a cellular phone or smart phone), a computer (e.g., a laptop), a tablet, a portable communication device, a portable computing device (e.g., a personal data assistant), an entertainment device (e.g., a music or video device, or a satellite radio), a global positioning system (GPS) device, or any other suitable device that is configured to communicate via a wireless or wired medium. In some aspects, the node is a wireless node. Such wireless node may provide, for example, connectivity for or to a network (e.g., a wide area network such as the Internet or a cellular network) via a wired or wireless communication link.

FIG. 1 shows an example wireless system 100 including an access point 110 and a number of user terminals 120. For simplicity, only one access point 110 is shown in FIG. 1. An access point, which is generally a fixed station that communicates with the user terminals 120, may also be referred to as a base station or a wireless device. A user terminal, which may be fixed or mobile, may also be referred to as a mobile station (STA) or a wireless device. The access point 110 may communicate with one or more user terminals 120 via downlink channels and/or uplink channels. The downlink channel (e.g., forward link) represents the communication link from the access point 110 to the user terminals 120, and the uplink channel (e.g., reverse link) represents the communication link from the user terminals 120 to the access point 110. A user terminal 120 may also communicate with another user terminal 120 using peer-to-peer communication techniques. A system controller 130 may provide coordination and control for the access point 110 and/or for other access points within or otherwise associated with the wireless system 100 (other access points not shown for simplicity).

For implementations in which one or more of the user terminals 120 may not support space-division multiple access (SDMA) signaling techniques, the access point 110 may be configured to communicate with both SDMA user terminals and non-SDMA user terminals. In this manner, the access point 110 may allow older versions of user terminals (e.g., "legacy" stations) that do not support SDMA signaling techniques to remain deployed in the wireless system 100 while allowing newer user terminals that support SDMA signaling techniques to be deployed within the wireless system 100.

The access point 110 may include a number ($N_{ap}$) of antennas to facilitate multiple-input (MI) downlink transmissions and multiple-output (MO) uplink transmissions for the wireless system 100. A set (K) of selected user terminals 120 may collectively provide multiple-output downlink transmissions and multiple-input uplink transmissions for the wireless system 100. For SDMA communications, the number of antennas on the access point 110 may be greater than or equal to the number of selected user terminals 120 (e.g., $N_{ap} \geq K \geq 1$) when the data streams for the K user terminals 120 are not multiplexed in code, frequency, or time. The number of selected user terminals 120 may be greater than the number of antennas on the access point 110 (e.g., $K > N_{ap}$) when the data streams are multiplexed (e.g., using time-division multiple access (TDMA), code-division multiple access (CDMA), orthogonal frequency-division multiple access (OFDMA), and/or other suitable multiple-access signaling techniques). Each selected user terminal 120 may transmit user-specific data to and/or receive user-specific data from the access point 110. In general, each of the selected user terminals 120 may include a number (Nut) of antennas. In some aspects, at least some of the selected user terminals 120 may have different numbers of antennas.

The wireless system 100 may be a time division duplex (TDD) system or a frequency division duplex (FDD) system. For a TDD system, downlink and uplink communications may operate on the same frequency band. For an FDD system, downlink and uplink communications may operate on different frequency bands. In some aspects, the wireless system 100 may utilize a single carrier or multiple carriers for transmission. In other aspects, the wireless system 100 may implement TDMA signaling techniques.

Figure 2:
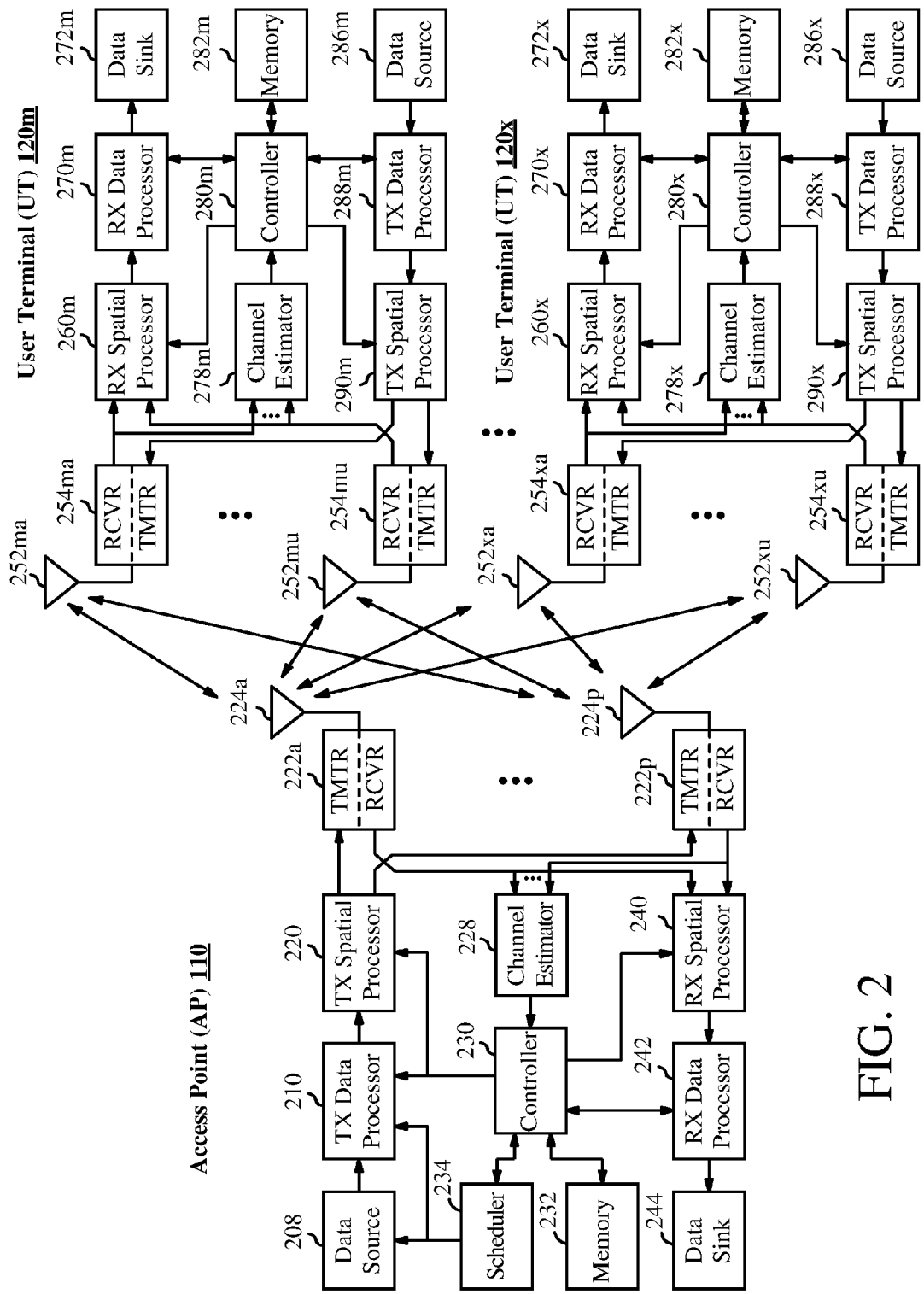
FIG. 2 shows a block diagram of an access point and a number of user terminals that may be implemented in a MIMO wireless system.

FIG. 2 shows the access point 110, a first user terminal 120m, and a second user terminal 120x of the wireless system 100 of FIG. 1. The access point 110 includes a number of antennas 224a-224p. The first user terminal 120m includes a number of antennas 252ma-252mu, and the second user terminal 120x includes a number of antennas 252xa-252xu. The access point 110 may be a transmitting entity for downlink communications, and may be a receiving entity for uplink communications. The user terminals 120 may be a transmitting entity for uplink communications, and may be a receiving entity for downlink communications. As used herein, a "transmitting entity" may refer to an apparatus or device capable of transmitting data via a wireless channel, and a "receiving entity" may refer to an apparatus or device capable of receiving data via a wireless channel. In the following description, the subscript "dn" denotes the downlink channel, and the subscript "up" denotes the uplink channel. For example, a number ($N_{up}$) of user terminals 120 may be selected for simultaneous transmission on the uplink channel, and a number (Nan) of user terminals 120 may be selected for simultaneous transmission on the downlink channel. The number of user terminals 120 selected for uplink transmissions may or may not be equal to the number of user terminals 120 selected for downlink transmissions. In some aspects, the access point 110 and/or the user terminals 120 may use beam-steering and/or other spatial processing techniques to communicate wireless signals with each other (and/or other wireless devices, not shown in FIG. 2 for simplicity).

Each of the user terminals 120 includes a TX data processor 288 that receives traffic data from a data source 286 and receives control data from a controller 280. For example, in the first user terminal 120m, the TX data processor 288m processes (e.g., encodes, interleaves, and modulates) traffic data based on a selected coding and modulation schemes, and generates a stream of data symbols. A TX spatial processor 290m performs spatial processing to convert the data symbol stream to a number of transmit symbol streams to be transmitted via the antennas 252ma-252mu. The first user terminal 120m includes a number of transceiver units 254ma-254mu, each of which includes a transmitter portion "TMTR" and a receiver portion "RCVR." Each of the transceiver units 254ma-254mu receives and processes (e.g., converts to analog, amplifies, filters, and frequency up-converts) a respective transmit symbol stream to generate an uplink signal, which in turn may be output for transmission via the antennas 252ma-252mu of the first user terminal 120m. Similarly, the second user terminal 120x includes a number of transceiver units 254xa-254xu, each of which includes a transmitter portion "TMTR" and a receiver portion "RCVR." Each of the transceiver units 254xa-254xu receives and processes (e.g., converts to analog, amplifies, filters, and frequency up-converts) a respective transmit symbol stream to generate an uplink signal, which in turn may be output for transmission via the antennas 252xa-252xu of the second user terminal 120x.

At the access point 110, antennas 224a-224p may receive uplink signals from the first user terminal 120m and/or from the second user terminal 120x. Each of the antennas 224a-224p provides a received signal to a respective one of a number of transceiver units 222a-222p. Each of the transceiver units 222a-222p includes a transmitter portion "TMTR" and a receiver portion "RCVR," and performs processing complementary to that performed by transmitter portions of the transceiver units 254ma-254mu of the first user terminal 120m and/or performs processing complementary to that performed by transmitter portions of the transceiver units 254xa-254xu of the second user terminal 120x. An RX spatial processor 240 performs receiver spatial processing on the received symbol streams from the receiver portions of transceiver units 222a-222p to generate uplink data symbol streams. The receiver spatial processing may be performed in accordance with a channel correlation matrix inversion (CCMI), a minimum mean square error (MMSE), a soft interference cancellation (SIC), or other suitable technique. Each recovered uplink data symbol stream may be an estimate of a data symbol stream transmitted by a respective one of user terminals 120. An RX data processor 242 processes (e.g., demodulates, de-interleaves, and decodes) each recovered uplink data symbol stream based on the modulation and coding scheme used for that stream to obtain decoded data. The decoded data for each of the user terminals 120 may be provided to a data sink 244 for storage and/or a controller 230 for further processing.

The access point 110 also includes a TX data processor 210 to receive data from a data source 208, to receive control data from a controller 230, and/or to receive additional data from a scheduler 234. The various types of data may be sent on different transport channels. TX data processor 210 processes (e.g., encodes, interleaves, and modulates) the data for each of the user terminals 120 based on the modulation and coding scheme selected for that user terminal 120. The TX data processor 210 may provide a respective downlink data symbol stream for the first user terminal 120m and the second user terminal 120x. A TX spatial processor 220 performs spatial processing (such as a precoding or beamforming) to convert the downlink data symbol streams to a number (Nan) of transmit symbol streams to be transmitted via the antennas 224a-224p of the access point 110. The transmitter portion of each of the transceiver units 222a-222p receives and processes a respective transmit symbol stream to generate a downlink signal. The transceiver units 222a-222p may provide the downlink signals for transmission via the antennas 224a-224p.

Antennas 252ma-252mu of the first user terminal 120m may receive downlink signals from the access point 110, and antennas 252xa-252xu of the second user terminal 120x may receive downlink signals from the access point 110. Each of the transceiver units 254ma-254mu in the first user terminal 120m processes a received signal from an associated one of antennas 252ma-252mu to recover a received symbol stream, and each of the transceiver units 254xa-254xu in the second user terminal 120x processes a received signal from an associated one of antennas 252xa-252xu to recover a received symbol stream. An RX spatial processor 260m within the first user terminal 120m performs receiver spatial processing on the received symbol streams to generate a downlink data symbol stream, and an RX spatial processor 260x within the second user terminal 120x performs receiver spatial processing on the received symbol streams to generate a downlink data symbol stream. The receiver spatial processing may be performed in accordance with the CCMI, MMSE, or other suitable technique. An RX data processor 270m within the first user terminal 120m processes (e.g., demodulates, de-interleaves and decodes) the recovered downlink data symbol stream to obtain decoded data, and an RX data processor 270x within the second user terminal 120x processes (e.g., demodulates, de-interleaves and decodes) the recovered downlink data symbol stream to obtain decoded data.

A channel estimator 278m within the first user terminal 120m may estimate the downlink channel response, and may provide downlink channel estimates (e.g., which may include channel gain estimates, SNR estimates, noise variance, and so on), and a channel estimator 278x within the second user terminal 120x may estimate the downlink channel response, and may provide downlink channel estimates (e.g., which may include channel gain estimates, SNR estimates, noise variance, and so on). Similarly, a channel estimator 228 within the access point 110 may estimate the uplink channel response, and may provide uplink channel estimates. A controller 280m within the first user terminal 120m may derive the spatial filter matrix for the first user terminal 120m based on the downlink channel response matrix $H_{dn,m}$, and a controller 280x within the second user terminal 120x may derive the spatial filter matrix for the second user terminal 120x based on the downlink channel response matrix $H_{dn,x}$. The controllers 280m and 280x may send feedback information (e.g., the downlink and/or uplink eigenvectors, eigenvalues, SNR estimates, and so on) to the access point 110.

A controller 230 may derive the spatial filter matrix for the access point 110 based on the effective uplink channel response matrix $H_{up,eff}$. In addition, the operation of various processing units within the access point 110 may be controlled and/or coordinated by controller 230, the operation of various processing units within the first user terminal 120m may be controlled and/or coordinated by controller 280m, and the operation of various processing units within the second user terminal 120x may be controlled and/or coordinated by controller 280x.

Figure 3:
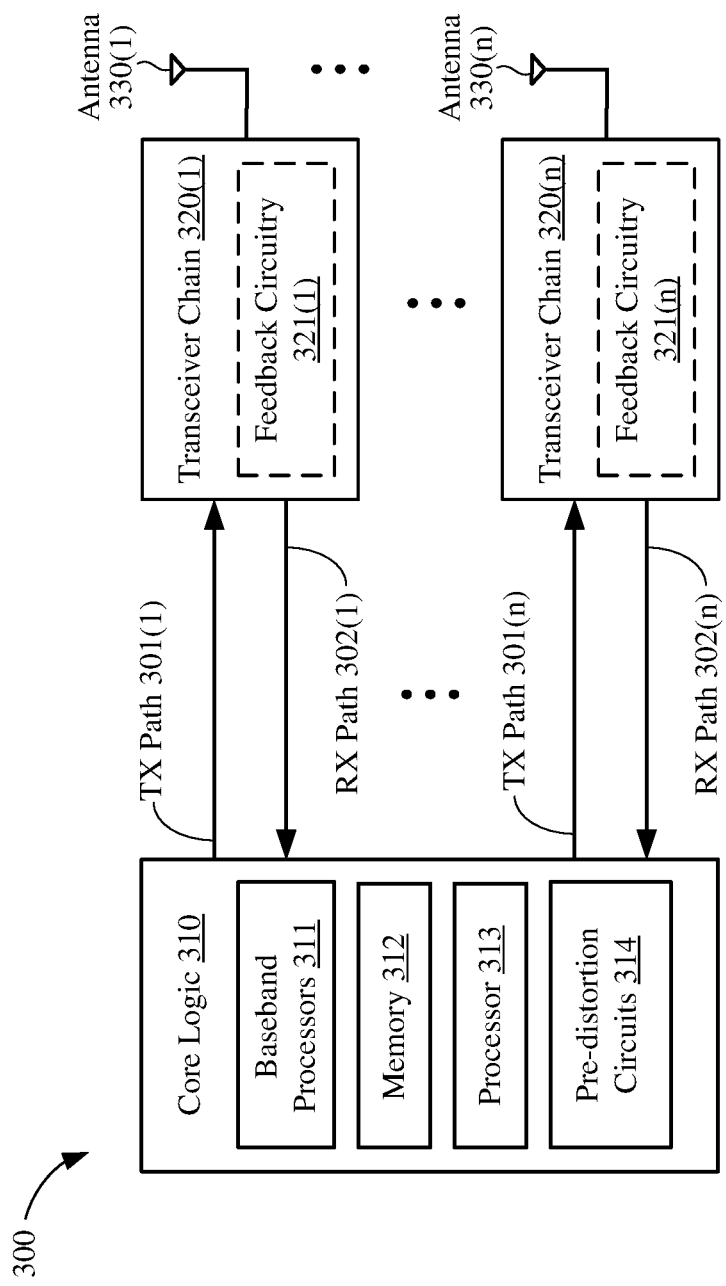
FIG. 3 shows a block diagram of a wireless device within which various aspects of the present disclosure may be implemented.

FIG. 3 shows a block diagram of an example wireless device 300 within which various aspects of the present disclosure may be implemented. Wireless device 300, which may be one implementation of the user terminals 120 of FIGS. 1-2, is shown to include core logic 310, a number of transceiver chains 320(1)-320(n), a number of antennas 330(1)-330(n), a number of transmit (TX) paths 301(1)-301(n), and a number of receive (RX) paths 302(1)-302(n). The core logic 310, which may include well-known components or circuits such as processors, memory devices, controllers, and the like, may perform general data generation and processing functions for the wireless device 300. For some implementations, the core logic 310 may operate (or cause transceiver chains 320(1)-320(n) to operate) in a normal mode and a calibration mode. For example, during the normal mode, the core logic 310 may generate digital data signals for transmission to one or more other devices, and may process data signals received from one or more other devices. During the calibration mode, the core logic 310 may generate a number of training signals from which pre-distortion coefficients may be generated, determined, or derived, for example, as described in more detail below.

The core logic 310 is shown to include a number of baseband processors 311, a memory 312, a processor 313, and a number of pre-distortion circuits 314. The baseband processors 311 may be used to process signals received from memory 312 and to forward the processed signals to transceiver chains 320(1)-320(n) for transmission via one or more of antennas 330(1)-330(n), and may be used to process signals received from one or more of antennas 330(1)-330(n) via transceiver chains 320(1)-320(n). More specifically, for transmission operations, digital data signals generated by baseband processors 311 may be filtered, up-converted (e.g., to a carrier frequency), and amplified by one or more of transceiver chains 320(1)-320(n) for transmission from wireless device 300 via one or more of antennas 330(1)-330(n). For reception operations, analog data signals received by one or more of antennas 330(1)-330(n) may be amplified, down-converted (e.g., to baseband), and filtered by one or more of transceiver chains 320(1)-320(n) prior to being received by the baseband processors 311.

Memory 312, which may be any suitable type of memory or storage device, may store data to be transmitted from wireless device 300, may store data received from other devices, may store one or more pre-distortion coefficients (e.g., generated, determined, or derived by the pre-distortion circuits 314), and may store other suitable information for facilitating the operation of wireless device 300. In some aspects, memory 312 may include a non-transitory computer-readable medium (e.g., one or more nonvolatile memory elements, such as EPROM, EEPROM, Flash memory, a hard drive, and so on) that may store one or more programs or software modules comprising instructions for execution by processor 313.

Processor 313, which may also be referred to as a central processing unit (CPU), may perform logical and arithmetic operations based on program instructions stored within the memory 312. More specifically, processor 313 may be one or more suitable processors capable of executing scripts or instructions of one or more software programs stored in wireless device 300 (e.g., within memory 312). In some aspects, processor 313 and memory 312 may be collectively referred to herein as a processing system.

The pre-distortion circuits 314 may be used to determine, generate, or derive one or more pre-distortion coefficients by outputting training signals to transceiver chains 320(1)-320(n) and then analyzing corresponding feedback signals provided from transceiver chains 320(1)-320(n). As described in more detail below, a first feedback signal generated when a power amplifier (not shown in FIG. 3 for simplicity) within a respective one of transceiver chains 320(1)-320(n) is turned on may include operating characteristics (e.g., non-linear behavior) of the power amplifier and parasitics of the corresponding transmit path 301 and/or receive path 302, and a second feedback signal generated when the power amplifier within the respective one of transceiver chains 320(1)-320(n) is turned off may include only (e.g., or substantially only) the parasitics of the corresponding transmit path 301 and/or receive path 302. The pre-distortion circuits 314 may then determine a number of pre-distortion coefficients based on differences between the first and second feedback signals. In some aspects, the pre-distortion circuits 314 may isolate the operating characteristics of the power amplifier from the transmit and receive path parasitics based on a comparison of the first and second feedback signals. Further, although the pre-distortion circuits 314 are depicted in FIG. 3 as being part of core logic 310, for other implementations, the pre-distortion circuits 314 may be separate from core logic 310.

Transceiver chain 320(1), which is coupled to core logic 310 via transmit path 301(1) and receive path 302(1), may be configured to transmit and/or receive wireless signals via antenna 330(1). Similarly, transceiver chain 320(n), which is coupled to core logic 310 via transmit path 301(n) and receive path 302(n), may be configured to transmit and/or receive wireless signals via antenna 330(n). More specifically, transceiver chain 320(1) may amplify outgoing signals generated by core logic 310 (e.g., signals generated by baseband processors 311) for transmission from wireless device 300 via antenna 330(1), and may amplify incoming signals received via antenna 330(1) to be processed by the core logic 310 (e.g., by baseband processors 311). Similarly, transceiver chain 320(n) may amplify outgoing signals generated by core logic 310 (e.g., signals generated by baseband processors 311) for transmission from wireless device 300 via antenna 330(n), and may amplify incoming signals received via antenna 330(n) to be processed by the core logic 310 (e.g., by baseband processors 311). Although not shown in FIG. 3 for simplicity, each of the transceiver chains 320(1)-320(n) may include a number of well-known components for transmitting and receiving wireless signals via antennas 330(1)-330(n). These well-known components may include, for example, power amplifiers, low noise amplifiers, attenuators, filters, mixers, impedance matching circuitry, and the like.

Although each of the transceiver chains 320(1)-320(n) is depicted in the example of FIG. 3 as being coupled to a corresponding one of antennas 330(1)-330(n), for other implementations, each of the transceiver chains 320(1)-320(n) may be selectively coupled to one or more of the antennas 330(1)-330(n) via a suitable antenna selection circuit or logic (not shown in FIG. 3 for simplicity). Further, in some aspects, each of the transceiver chains 320(1)-320(n) may be configured to operate as a half-duplex transceiver. In other aspects, each of the transceiver chains 320(1)-320(n) may be configured to operate as a full-duplex transceiver.

Each of the transceiver chains 320(1)-320(n) may include a respective one of feedback circuits 321(1)-321(n). As mentioned above, the core logic 310 (e.g., the pre-distortion circuits 314) may output one or more training signals to the transceiver chains 320(1)-320(n) via respective transmit paths 301(1)-301(n), and then analyze corresponding feedback signals provided from the transceiver chains 320(1)-320(n) via respective receive paths 302(1)-302(n). In accordance with aspects of the present disclosure, the feedback circuits 321(1)-321(n) may provide the feedback signals from transceiver chains 320(1)-320(n) to the core logic 310 via respective receive paths 302(1)-302(n), for example, rather than using one or more dedicated feedback signal lines coupled between the transceiver chains 320(1)-320(n) and the core logic 310. In this manner, such dedicated feedback signal lines may be omitted from wireless device 300, thereby reducing the chip die size, package dimensions, and circuit overhead of the wireless device 300 (e.g., as compared to devices that include dedicated feedback signal lines).

Figure 4:
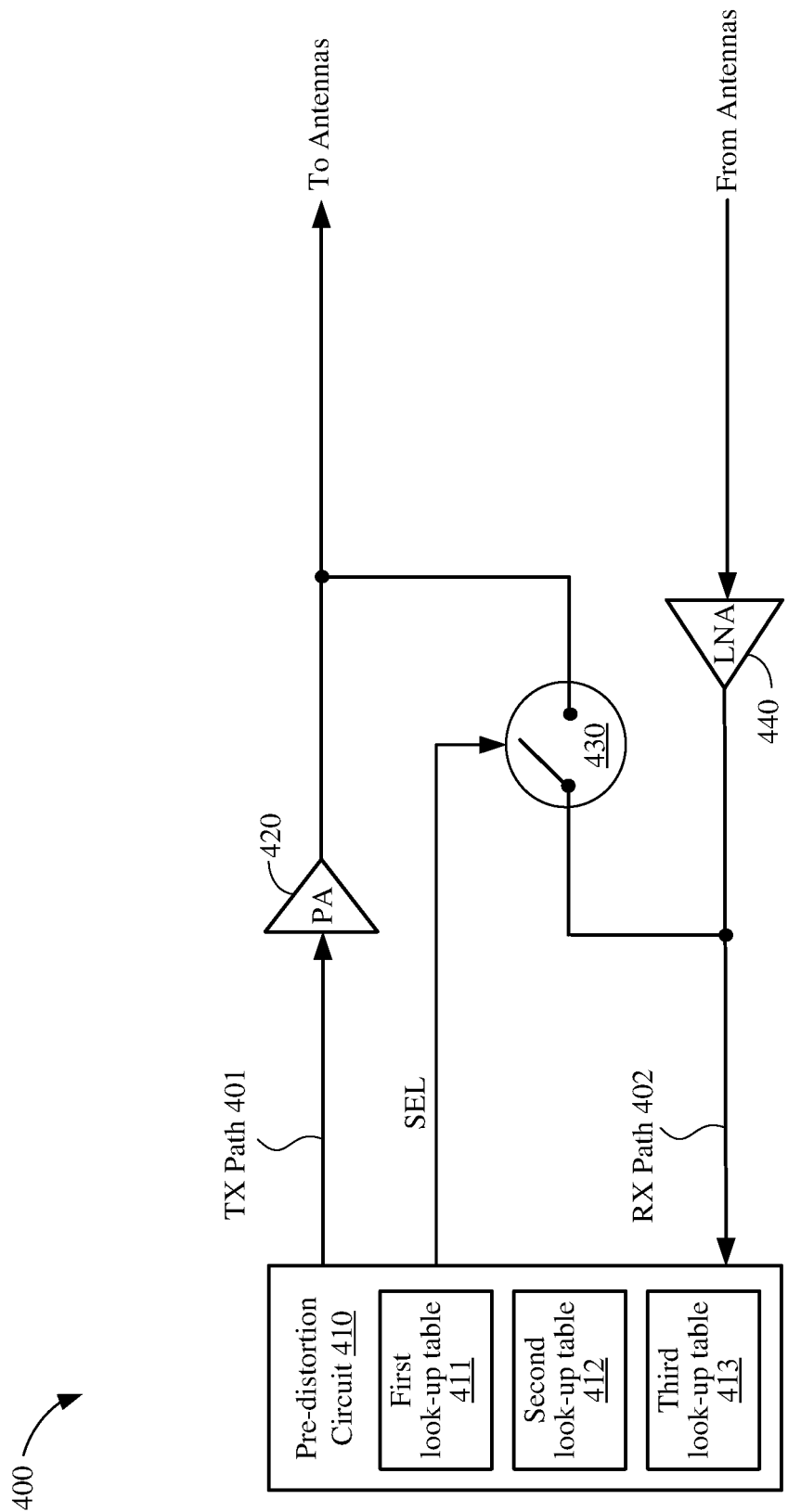
FIG. 4 shows a block diagram of an apparatus in accordance with various aspects of the present disclosure.

FIG. 4 shows a block diagram of an example apparatus 400 in accordance with various aspects of the present disclosure. The apparatus 400, which may be one implementation of transceiver chains 320(1)-320(n) of FIG. 3, may include a transmit (TX) path 401, a receive (RX) path 402, a pre-distortion circuit 410, a power amplifier 420, a switch 430, and a low noise amplifier 440. Although not shown in FIG. 4 for simplicity, the apparatus 400 may also include other components including, for example, attenuators, impedance matching circuitry, mixers, filters, and the like. Further, although the pre-distortion circuit 410 is depicted in the example of FIG. 4 as part of apparatus 400, for other implementations, the pre-distortion circuit 410 may be separate from apparatus 400. In some aspects, the pre-distortion circuit 410 may be part of a wireless device's core logic, for example, as described above with respect to FIG. 3. Thus, in some aspects, the pre-distortion circuit 410 may be one implementation of the pre-distortion circuits 314 of FIG. 3.

The power amplifier 420 is provided along the transmit path 401 between the pre-distortion circuit 410 and the antennas, and the LNA 440 is provided along the receive path 402 between the antennas and the pre-distortion circuit 410 (antennas not shown in FIG. 4 for simplicity). More specifically, an input terminal of the power amplifier 420 is coupled to an output terminal of the pre-distortion circuit 410 via the transmit path 401, and an output terminal of the power amplifier 420 is coupled to the antennas. An input terminal of the LNA 440 is coupled to the antennas, and an output terminal of the LNA 440 is coupled to an input terminal of the pre-distortion circuit 410 via the receive path 402.

The switch 430, which may be any suitable switch or switching device, includes a first terminal coupled to the output terminal of the power amplifier 420, includes a second terminal coupled to the output terminal of the LNA 440, and includes a control terminal to receive a select signal (SEL). When the select signal is driven to a first state (e.g., to an asserted state), the switch 430 is closed and couples the output terminal of the power amplifier 420 to the output terminal of the LNA 440. Thus, when closed, the switch 430 may couple the transmit path 401 to the receive path 402, for example, so that signals amplified by the power amplifier 420 may be routed to the pre-distortion circuit 410 via the receive path 402. Conversely, when the select signal is driven to a second state (e.g., to a de-asserted state), the switch 430 is open and isolates the output terminal of the power amplifier 420 from the receive path 402 (and from the output terminal of the LNA 440). Thus, when open, the switch 430 may prevent signals amplified by the power amplifier 420 from being routed to the pre-distortion circuit 410 via the receive path 402.

The select signal may be generated by the pre-distortion circuit 410. For some implementations, the pre-distortion circuit 410 may assert the select signal during the calibration mode, for example, so that signals amplified (or passed without amplification) by power amplifier 420 may be routed as feedback signals to the pre-distortion circuit 410 via the receive path 402. Conversely, the pre-distortion circuit 410 may de-assert the select signal during the normal mode, for example, so that signals amplified by power amplifier 420 to be transmitted to one or more other devices are not routed as feedback signals to the pre-distortion circuit 410. For other implementations, the select signal may be generated by any suitable circuit or component provided within or associated with a wireless device within which the apparatus 400 resides.

For example, during the calibration mode, the pre-distortion circuit 410 may output a first training signal on the transmit path 401 while the power amplifier 420 is on. The power amplifier 420 may amplify the first training signal to generate an amplified training signal, which may be used as the first feedback signal. The switch 430 may couple the transmit path 401 to the receive path 402, and thereby provide a return path for the first feedback signal to the pre-distortion circuit 410 via the receive path 402 while bypassing the low noise amplifier 440. In this manner, the pre-distortion circuit 410 may receive the first feedback signal via the receive path 402, for example, without using a dedicated feedback signal line.

As described above, the power amplifier 420 amplifies the first training signal (as received via the transmit path 401) to generate the first feedback signal, which in turn is routed to the pre-distortion circuit 410 via the receive path 402. Thus, the first feedback signal, as received by the pre-distortion circuit 410, may include one or more operating characteristics of the power amplifier 420 as well as parasitics associated with the transmit path 401 and/or the receive path 402. It is noted that because the first feedback signal bypasses the low noise amplifier 440, the first feedback signal may not include characteristics of the low noise amplifier 440.

The pre-distortion circuit 410 may determine a transfer function of the power amplifier 420 based on the first feedback signal received via the receive path 402, for example, using any suitable digital pre-distortion technique or algorithm. More specifically, the first feedback signal may be a digital representation of the complex (I/Q) waveform of the first training signal (e.g., the outgoing signal) and the first feedback signal (e.g., the returning signal). In some aspects, the pre-distortion circuit 410 may perform a complex gain adjustment operation on the first training signal to minimize errors associated with the first feedback signal. The resulting complex gain adjustment coefficient, which may be indicative of the transfer function (e.g., the operating characteristics) of the power amplifier 420, may be stored in a first look-up table 411 provided within (or otherwise associated with) the pre-distortion circuit 410. For some implementations, the pre-distortion circuit 410 may determine a complex gain adjustment coefficient for each of a plurality of different transmit power levels, for example, by performing the above-described operation with first training signals set to each of the plurality of different transmit power levels. The resulting plurality of complex gain adjustment coefficients may be stored in the first look-up table 411.

The pre-distortion circuit 410 may then output a second training signal on the transmit path 401 while the power amplifier 420 is off. For some implementations, only the output stages of the power amplifier 420 may be powered down, for example, to maintain the impedance matching conditions of the input terminal of the power amplifier 420. The power amplifier 420 may pass the second training signal as a second feedback signal to the switch 430 (e.g., without amplifying the second training signal), which in turn may route the second feedback signal to the pre-distortion circuit 410 via the receive path 402. In this manner, the pre-distortion circuit 410 may receive the second feedback signal via the receive path 402 while bypassing the LNA 440 and without using a dedicated feedback signal line.

Because the power amplifier 420 is turned off when the pre-distortion circuit 410 outputs the second training signal on the transmit path 401, the second feedback signal, as received by the pre-distortion circuit 410, may include parasitics associated with the transmit path 401 and/or the receive path 402 but not include characteristics of the power amplifier 420. It is noted that because the second feedback signal bypasses the low noise amplifier 440, the second feedback signal may not include characteristics of the low noise amplifier 440.

Upon receiving the second feedback signal from the receive path 402, the pre-distortion circuit 410 may determine the amplitude and phase of the second feedback signal, and then store the amplitude and phase of the second feedback signal in a second look-up table 412 provided within (or otherwise associated with) the pre-distortion circuit 410. For some implementations, the pre-distortion circuit 410 may repeat the above-described operation for each of a plurality of different transmit power levels, for example, to determine amplitude and phase values of the second feedback signal at each of the plurality of different transmit power levels. More specifically, the pre-distortion circuit 410 may, for a given transmit power level, output the second training signal at the given transmit power level and then determine the amplitude and phase value of the corresponding second feedback for the given transmit power level. The plurality of amplitude and phase values of the second feedback signals may be stored in the second look-up table 412.

As mentioned above, because the power amplifier 420 is turned off (or at least not fully turned on), the second feedback signals may not include operating characteristics of the power amplifier 420. More specifically, the amplitude and phase values stored in the second look-up table 412 may represent undesirable parasitics and other "pollution" associated with the transmit path 401 and/or the receive path 402, but not the operating characteristics of the power amplifier 420. Thus, as explained below, the pre-distortion circuit 410 may use the complex gain adjustment coefficients stored in the first look-up table 411 and the amplitude and phase values stored in the second look-up table 412 to determine one or more pre-distortion coefficients that represent only the transfer function of the power amplifier 420 (e.g., and not the transmit or receive path parasitics).

The pre-distortion circuit 410 may determine the one or more pre-distortion coefficients based on a difference between the first and second feedback signals. The one or more pre-distortion coefficients may be used to compensate for undesired (e.g., non-linear) characteristics of the power amplifier 420. In some aspects, the one or more pre-distortion coefficients may be used to pre-condition data signals prior to amplification by the power amplifier 420. In other aspects, the one or more pre-distortion coefficients may be used to adjust a number of settings (e.g., gain settings) of the power amplifier 420, for example, to ensure that the power amplifier 420 remains in a linear region of operation during transmission operations.

More specifically, for some implementations, the pre-distortion circuit 410 may, for a given transmit power level, superimpose the complex gain adjustment coefficient associated with the first feedback signal with the amplitude and phase values of the second feedback signal to determine the pre-distortion coefficient for the given transmit power level. The resulting pre-distortion coefficients may be stored in a third look-up table 413 of the pre-distortion circuit 410.

Thereafter, to transmit data signals from the wireless device during the normal mode, the pre-distortion circuit 410 may apply one or more of the pre-distortion coefficients to the data signals to generate pre-distorted data signals. The pre-distorted data signals, which may compensate for the operating characteristics of the power amplifier 420, may be amplified by the power amplifier 420 and then routed to the antennas for transmission to one or more other devices. In this manner, the pre-distorted data signals amplified by the power amplifier 420 may not exhibit non-linear characteristics even when the power amplifier 420 is operating in the non-linear region.

More specifically, for at least some implementations, the pre-distortion circuit 410 may first detect a power level of a data signal to be transmitted to one or more other devices. The pre-distortion circuit 410 may retrieve the complex gain adjustment coefficient corresponding to the detected power level from the first look-up table 411, and retrieve the amplitude and phase values corresponding to the detected power level from the second look-up table 412. Then, the pre-distortion circuit 410 may subtract the retrieved amplitude and phase values from the retrieved complex gain adjustment coefficient to determine one or more pre-distortion coefficients for the detected power level. In this manner, the pre-distortion circuit 410 may determine pre-distortion coefficients based on the transfer function of power amplifier 420 (e.g., without the parasitics of the transmit path 401 and the receive path 402).

In some aspects, the pre-distortion circuit 410 may recalibrate the digital pre-distortion in response to changes in the operating temperature, supply load, or frequency of operation of the power amplifier 420.

It is noted that although the first look-up table 411, the second look-up table 412, and the third look-up table 413 are depicted in the example of FIG. 4 as separate look-up tables, for other implementations, the look-up tables 411-413 may be a single look-up table (or other suitable memory device).

Further, in accordance with some aspects of the present disclosure, the apparatus 400 may be configured to determine the one or more pre-distortion coefficients (e.g., using the first and second training signals) while also receiving signals transmitted from one or more other devices. More specifically, for at least some implementations, the first and second feedback signals may be time-division multiplexed with the received signals on the receive path 402. In this manner, the reception of signals transmitted from other devices may not be interrupted by operations for determining the pre-distortion coefficients.

Figure 5:
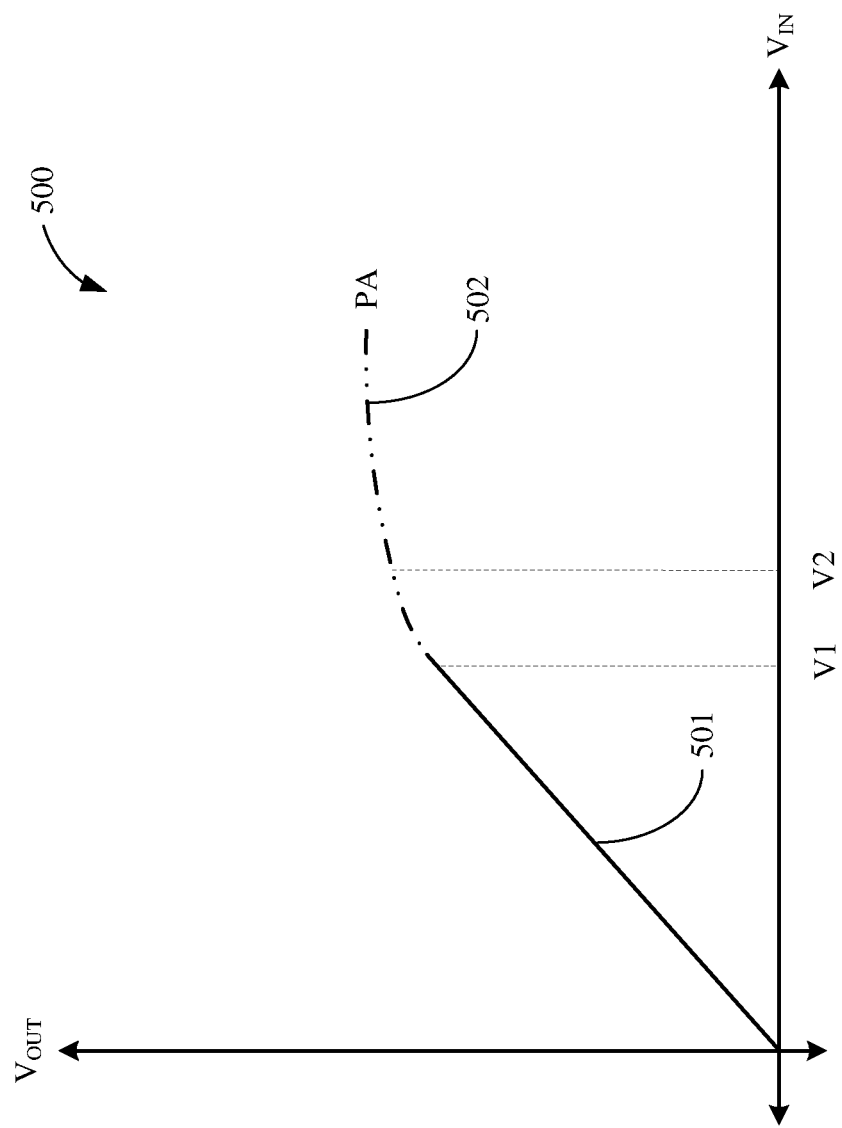
FIG. 5 shows a graph depicting an example non-linear transfer function of a power amplifier in accordance with various aspects of the present disclosure.

FIG. 5 is a graph 500 depicting an example non-linear transfer function of the power amplifier 420 of FIG. 4. The solid line 501 depicts a linear region for which the relationship between the input voltage ($V_{IN}$) and the output voltage ($V_{OUT}$) of the power amplifier 420 has a constant slope (e.g., is linear), and the dashed line 502 depicts a non-linear region of the power amplifier 420. The non-linear region depicted by dashed line 502 may result from $N^{th}$-order harmonics in the transfer function of the power amplifier 420 that cause the output voltage $V_{OUT}$ to compress and shift phase as the input voltage $V_{IN}$ increases beyond a certain amount. The non-linear behavior of the power amplifier 420 may cause output signals generated by the power amplifier 420 to spread into other frequencies, thereby causing interference in other radio channels (e.g., among other problems).

Figure 6:
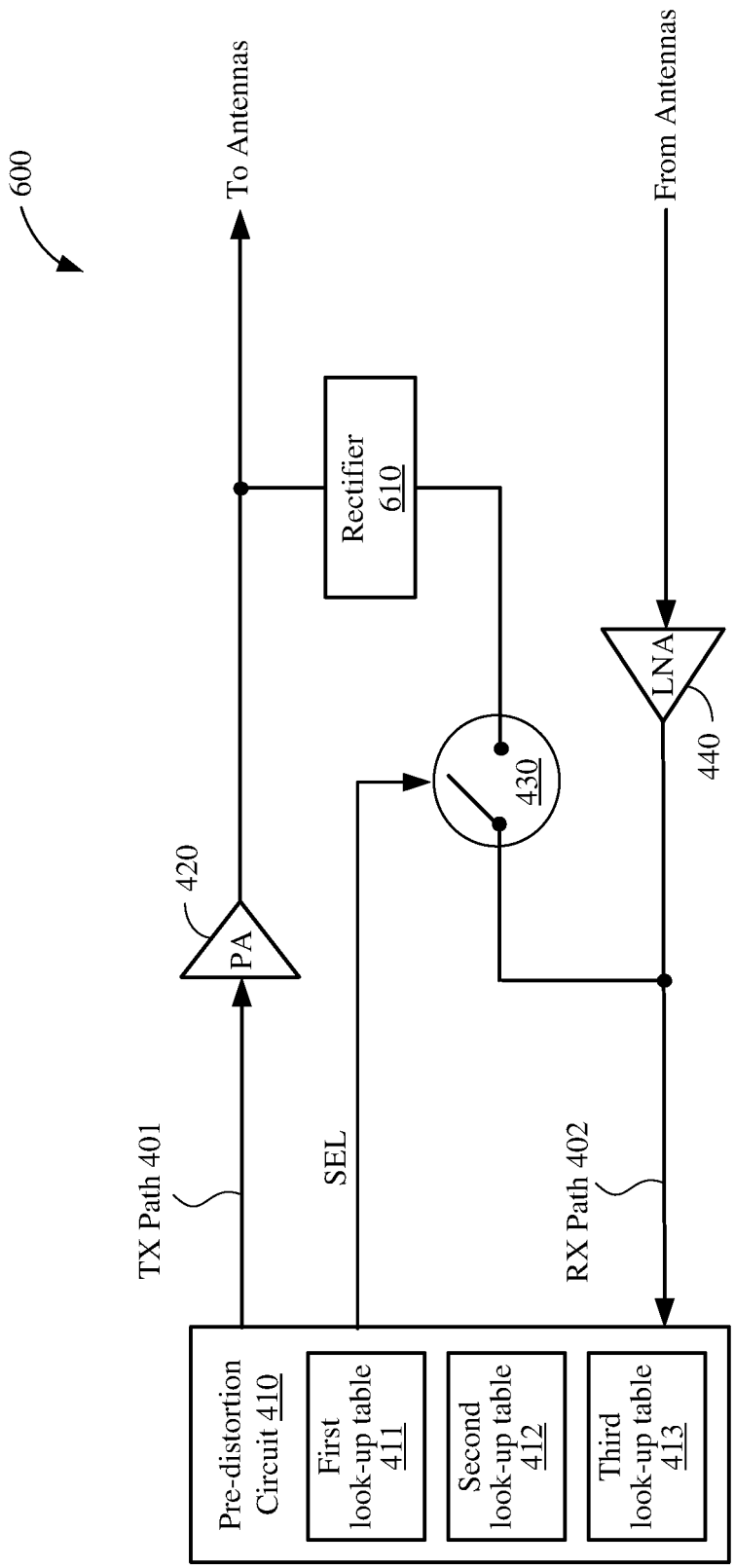
FIG. 6 shows a block diagram of an apparatus in accordance with various aspects of the present disclosure.

FIG. 6 shows a block diagram of an example apparatus 600 in accordance with various aspects of the present disclosure. The apparatus 600, which may be one implementation of transceiver chains 320(1)-320(n) of FIG. 3, may include the transmit path 401, the receive path 402, the pre-distortion circuit 410, the power amplifier 420, the switch 430, and the LNA 440 of the example apparatus 400 of FIG. 4, plus a rectifier 610 coupled between the output terminal of the power amplifier 420 and the switch 430. In some aspects, the rectifier 610 may be a squarer. In other aspects, the rectifier 610 may be any suitable rectifier.

Although not shown in FIG. 6 for simplicity, the apparatus 600 may also include other components including, for example, attenuators, impedance matching circuitry, mixers, filters, and the like. Further, although the pre-distortion circuit 410 is depicted in the example of FIG. 6 as part of apparatus 600, for other implementations, the pre-distortion circuit 410 may be separate from apparatus 600. In some aspects, the pre-distortion circuit 410 may be part of a wireless device's core logic, for example, as described above with respect to FIG. 3. Thus, in some aspects, the pre-distortion circuit 410 may be one implementation of the pre-distortion circuits 314 of FIG. 3.

The apparatus 600 may operate in a normal mode and in a calibration mode, for example, in a manner similar to that described above with respect to FIG. 4. For the normal mode, the switch 430 may isolate the output of the power amplifier 420 from the receive path 402, and the pre-distortion circuit 410 may apply one or more pre-distortion coefficients to a data signal to generate a pre-distorted data signal. As described above with respect to FIG. 4, the pre-distorted data signal may compensate for undesirable operating characteristics (e.g., non-linear characteristics) of the power amplifier 420. The pre-distorted data signal may be provided to the power amplifier 420 via the transmit path 401, and the power amplifier 420 may amplify the pre-distorted data signal to an appropriate transmit power level for transmission as an RF transmit signal to one or more other wireless devices.

For the calibration mode, the switch 430 may couple the output of the power amplifier 420 to the receive path 402 via the rectifier 610, thereby providing a feedback path from the output of the power amplifier 420 to the pre-distortion circuit 410 via the receive path 402. As discussed above, the feedback path provided by the switch 430 may bypass the low noise amplifier 440, for example, so that feedback signals routed to the pre-distortion circuit 410 do not include non-linear characteristics (or other characteristics) of the low noise amplifier 440.

The rectifier 610 may rectify a copy of the signal amplified by the power amplifier 420 to generate a rectified feedback signal. In some aspects, the rectified feedback signal may be a rectified, averaged, and/or scaled version of the amplified signal output from the power amplifier 420. In these aspects, the rectified feedback signal may be a DC signal having an amplitude that corresponds to the power level of the RF transmit signal.

The rectified feedback signal may be multiplexed with received signals on the receive path 402, for example, so the rectified feedback signal may be routed to the pre-distortion circuit 410 without interrupting reception of wireless signals by apparatus 600. In some aspects, the rectified feedback signal may be time division multiplexed with received signals on the receive path 402. In other aspects, the rectified feedback signal may be multiplexed with received signals on the receive path 402 using any other suitable multiplexing technique. The rectified feedback signal may prevent the feedback of RF power from the power amplifier 420 from causing unwanted interference (e.g., inter-chain crosstalk) in the pre-distortion circuit 410. In some implementations, the pre-distortion circuit 410 may operate at DC, which may greatly reduce power consumption.

The pre-distortion circuit 410 may monitor the rectified feedback signal, and compare the power level of the rectified feedback signal with a target power level. The pre-distortion circuit 410 may adjust the pre-distortion coefficients stored in the third look-up table 413 and/or may adjust the amplitude of data signals to be transmitted from apparatus 600. The pre-distortion circuit 410 may make these adjustments based on the difference in power between the rectified feedback signal and the target power level, for example, so that the power level of data signals amplified by the power amplifier 420 equals to the target power level. In some aspects, the pre-distortion circuit 410 may adjust the pre-distortion coefficients and/or the amplitude of the data signals if the difference in power between the rectified feedback signal and the target power level exceeds a threshold amount. The pre-distortion circuit 410 may also monitor the rectified feedback signal and adjust the pre-distortion coefficients and/or the amplitude of the data signals on a packet by packet basis.

For each packet of the data signal that is to be transmitted, the pre-distortion circuit 410 may retrieve the complex gain adjustment coefficients from the first look-up table 411 and retrieve the amplitude and phase values from the second look-up table 412 corresponding to the new amplitude (if an adjustment has occurred), and thereafter derive a new pre-distortion coefficient to be used for preamble-distorting data signals prior to amplification by the power amplifier 420.

In addition, or as an alternative, the pre-distortion circuit 410 may adjust the modulation and coding scheme (MCS) used for transmitting the data signal in response to detecting a difference in power between the rectified feedback signal and the target power, for example, to equalize the power of the data signal to the target power.

Referring again to FIG. 4, for some implementations, a copy of the RF transmit signal may be routed to the pre-distortion circuit 410 via the receive path 402 of the apparatus 400 and used as an RF feedback signal for power control in a manner similar to that described above with respect to FIG. 4.

Figure 7:
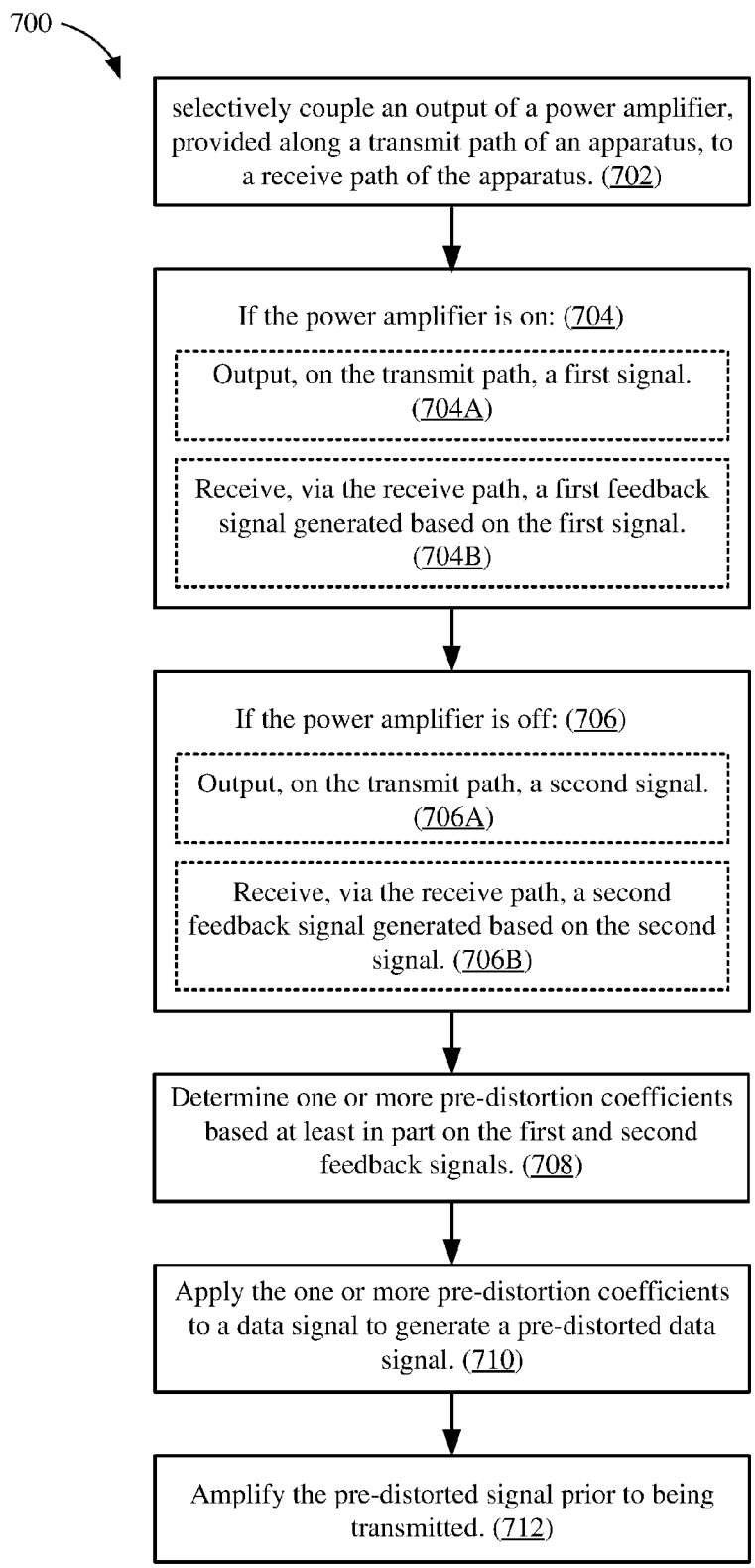
FIG. 7 shows an illustrative flow chart depicting an operation for digital pre-distortion in accordance with some aspects of the present disclosure.

FIG. 7 is an illustrative flow chart depicting an example operation 700 for digital pre-distortion in accordance with some aspects of the present disclosure. Although the example operation 700 is described below as performed by the apparatus 400 of FIG. 4, the example operation 700 may be performed by any suitable device (e.g., including apparatus 600). First, an output of the power amplifier 420, provided along the transmit path 401 of the apparatus 400, may be selectively coupled to a receive path 402 of the apparatus 400 (702). For example, the pre-distortion circuit 410 may assert the select signal to cause the switch 430 to close, thereby coupling the output of the power amplifier 420 to the receive path 402. In some aspects, causing the switch 430 to close may correspond to a calibration mode.

If the power amplifier 420 is on (704), the pre-distortion circuit 410 may output a first signal on the transmit path 401 (704A). In some aspects, the first signal may be a first training signal. The pre-distortion circuit 410 may then receive, via the receive path 402, a first feedback signal generated based on the first signal (704B). In some aspects, the first feedback signal may include one or more characteristics of the power amplifier 420, as well as parasitics of the transmit path 401 and/or the receive path 402.

If the power amplifier 420 is off (706), the pre-distortion circuit 410 may output a second signal on the transmit path 401 (706A). In some aspects, the second signal may be a second training signal. The pre-distortion circuit 410 may then receive, via the receive path 402, a second feedback signal generated based on the second signal (706B). In some aspects, the second feedback signal may include parasitics of the transmit path 401 and/or the receive path 402, but not include the one or more characteristics of the power amplifier 420.

The pre-distortion circuit 410 may determine one or more pre-distortion coefficients based at least in part on the first and second feedback signals (708). In some aspects, the pre-distortion circuit 410 may determine a transfer function of the power amplifier 420 based on the first feedback signal, and store the transfer function as a complex gain adjustment coefficient in the first look-up table 411. The pre-distortion circuit 410 may determine the amplitude and phase of the second feedback signal, and then store the amplitude and phase of the second feedback signal in the second look-up table 412. The pre-distortion circuit 410 may then superimpose the complex gain adjustment coefficient associated with the first feedback signal with the amplitude and phase values of the second feedback signal to determine the one or more pre-distortion coefficients.

Then, the pre-distortion circuit 410 may apply the one or more pre-distortion coefficients to a data signal to generate a pre-distorted data signal (710). In some aspects, the pre-distorted data signal may be configured to compensate for the one or more characteristics of the power amplifier 420.

Thereafter, during a normal mode, the power amplifier 420 may amplify the pre-distorted signal prior to being transmitted from the apparatus 400 (712).

Figure 8:
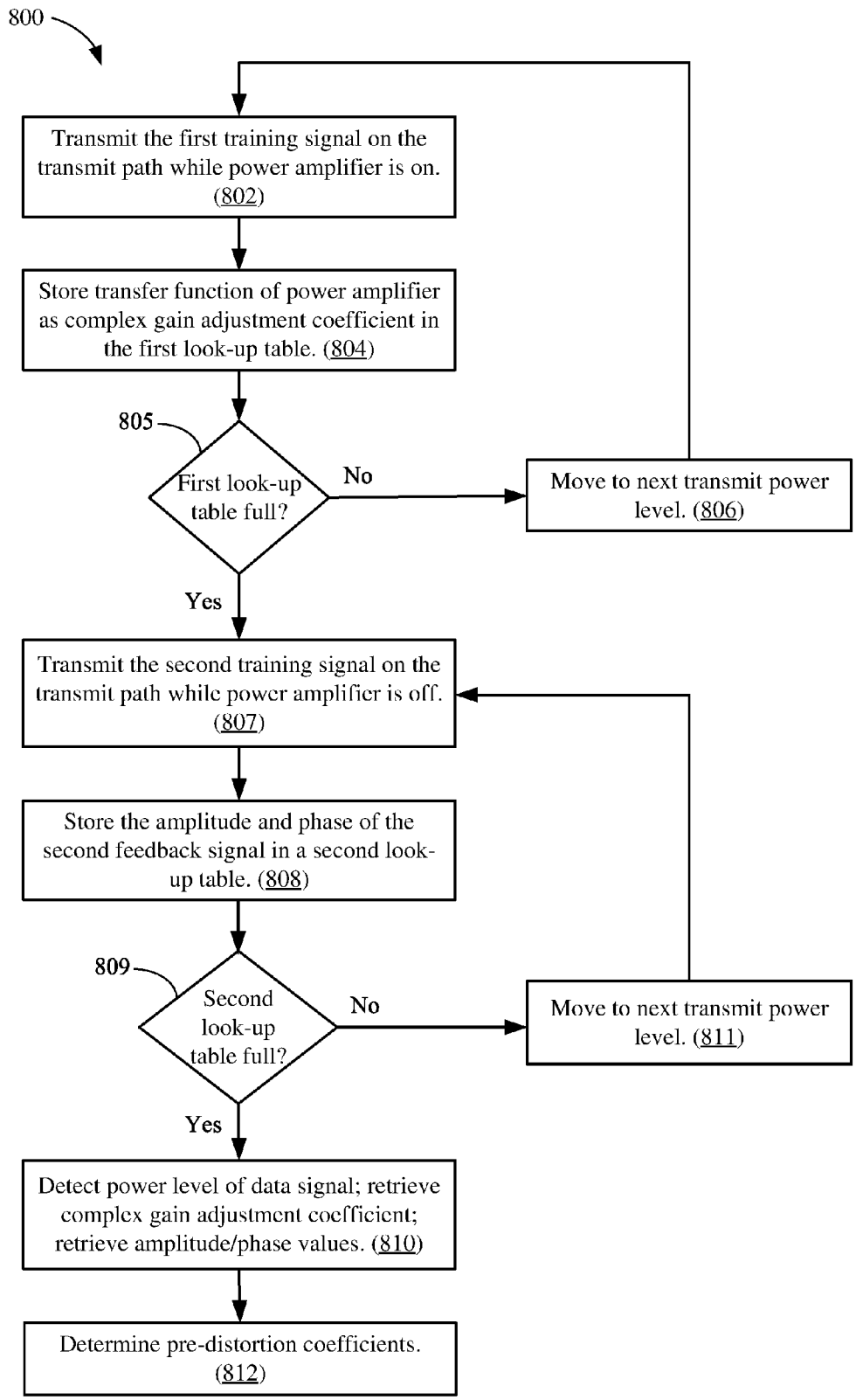
FIG. 8 shows an illustrative flow chart depicting an operation for digital pre-distortion calibration operation in accordance with other aspects of the present disclosure.

FIG. 8 shows an illustrative flow chart depicting an example operation 800 for digital pre-distortion calibration in accordance with other aspects of the present disclosure. Although the example operation 800 is described below as performed by the apparatus 400 of FIG. 4, the example operation 800 may be performed by any suitable device. First, the pre-distortion circuit 410 may output a first training signal on the transmit path 401 while the power amplifier 420 is on (802). The power amplifier 420 may amplify the first training signal to generate a first feedback signal.

The pre-distortion circuit 410 may receive the first feedback signal from the receive path 402. The pre-distortion circuit 410 may determine a transfer function of the power amplifier 420 based on the first feedback signal, and store the transfer function as a complex gain adjustment coefficient in the first look-up table 411 (804). If the first look-up table 411 is not full (805), the pre-distortion circuit 410 may repeat this process for a next transmit power level (806).

If the first look-up table 411 is full (805), the pre-distortion circuit 410 may transmit a second training signal on the transmit path 401 while the power amplifier 420 is off (807). In some aspects, the apparatus 400 may completely power down the power amplifier 420. In other aspects, the apparatus 200 may power down only the output stages of the power amplifier 420, so as to maintain the impedance matching conditions of the power amplifier input.

The pre-distortion circuit 410 may receive the second feedback signal from the receive path 402. The pre-distortion circuit 410 may store the amplitude and phase of the second feedback signal in a second look-up table (808). If the second look-up table 412 is not full (809), the pre-distortion circuit 410 may repeat this process for a next transmit power level (811).

If the second look-up table 412 is full (809), the pre-distortion circuit 410 may detect the transmit power of an outgoing data signal and retrieve the corresponding complex gain adjustment coefficient from the first look-up table 411 and retrieve the corresponding amplitude and phase values from the second look-up table 412 (810).

Thereafter, the pre-distortion circuit 410 may subtract the amplitude and phase values from the complex gain adjustment coefficient to determine one or more pre-distortion coefficients (812). In this manner, the pre-distortion circuit 410 may generate or determine pre-distortion coefficients based on the transmit power level of the data signal. The pre-distortion circuit 410 may apply the pre-distortion coefficients to the data signal to generate a pre-distorted data signal. In this manner, the pre-distortion circuit 410 may compensate for the non-linear characteristics of the power amplifier 420 while accounting for the parasitic characteristics of the transmit path 401 and the receive path 402.

Figure 9:
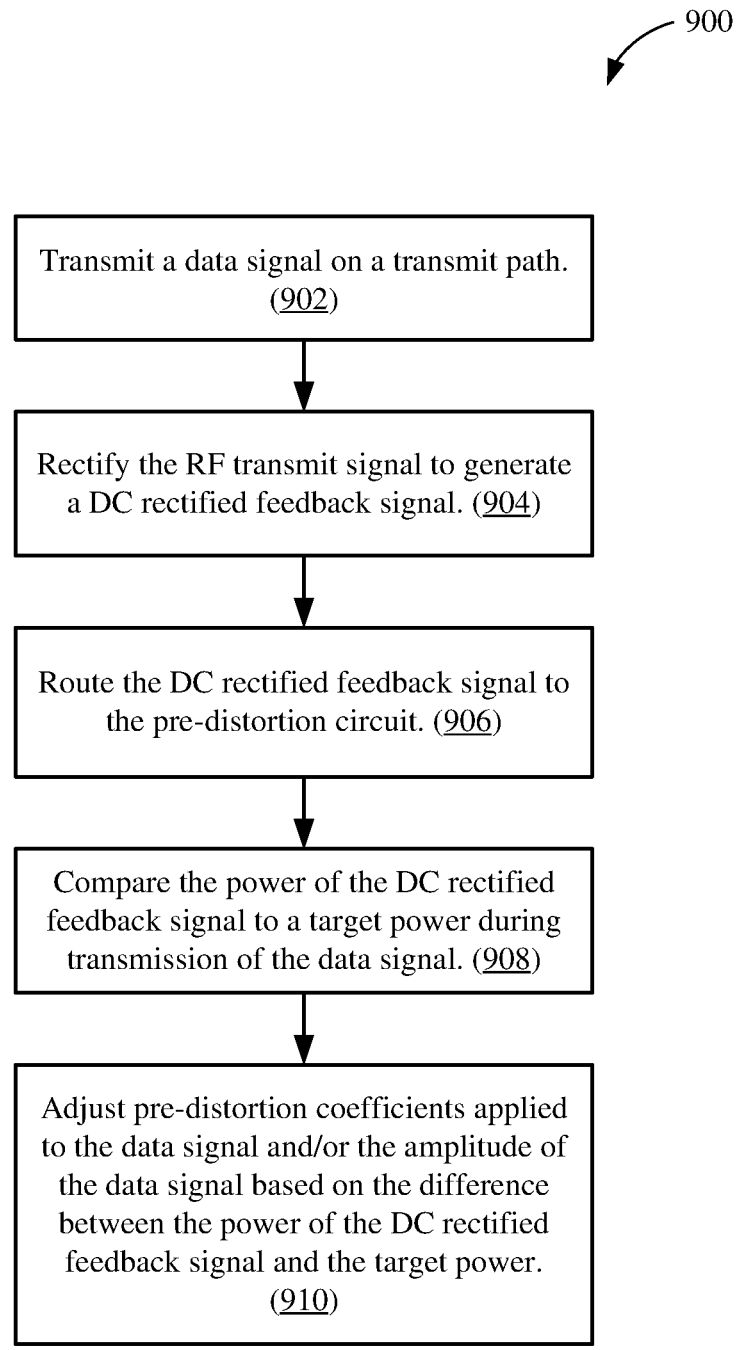
FIG. 9 shows an illustrative flow chart depicting an operation for closed loop power control in accordance with various aspects of the present disclosure.

FIG. 9 shows an illustrative flow chart depicting an example operation 900 for closed loop power control in accordance with various aspects of the present disclosure. Although the example operation 900 is described below as performed by the apparatus 400 of FIG. 4, the example operation 900 may be performed by any suitable device.

The apparatus 400 may operate in transmission mode to transmit a data signal to another wireless device via the transmit path 401 (902). Prior to transmission, the apparatus 400 may apply pre-distortion coefficients to such data signals to compensate for non-linear characteristics of the power amplifier 420. The pre-distortion coefficients may be derived in the manner described above with respect to FIG. 8. The apparatus 400 may generate an RF transmit signal at the output of the power amplifier 420 by amplifying the pre-distorted data signal to an appropriate transmit power. The apparatus 400 may output the RF transmit signal to one or more antennas for transmission to one or more other wireless devices.

The apparatus 400 may rectify a copy of the RF transmit signal to generate a DC rectified feedback signal (904). In some aspects, the apparatus 400 may utilize a squarer to rectify the RF transmit signal. In other aspects, any suitable rectifier may be used. The DC rectified transmit signal may be a rectified/averaged and scaled version of the RF transmit signal and therefore may be a DC signal having an amplitude that corresponds to the power of the RF transmit signal.

The apparatus 400 may route the DC rectified feedback signal to the pre-distortion circuit 410 via the receive path 402 of the apparatus 400 (906). The apparatus 400 may activate a return path for the DC rectified transmit signal to the pre-distortion circuit 410 via the receive path 402 using the switch 430. By feeding back a rectified version of the RF transmit signal to the pre-distortion circuit, the apparatus 400 may prevent feedback of RF power from the RF transmit signal from causing unwanted interference at the pre-distortion circuit 410. For example, introduction of RF power to the pre-distortion circuit 410 may cause inter-chain cross talk. For some implementations, the apparatus 400 may operate the pre-distortion circuit 410 at DC when receiving the DC rectified feedback signal, which may greatly reduce power consumption. The DC rectified transmit signal may be time division multiplexed or multiplexed together with received signals on the receive path 402.

The apparatus 400 may monitor the received DC rectified feedback signal during transmission of the data signal and compare the power of the DC rectified feedback signal with a target power (908). The apparatus 400 may then adjust the pre-distortion coefficients applied to the data signal and/or an amplitude of the data signal prior to transmission based on the difference in power between the DC rectified transmit signal and the target power (910). For some implementations, the pre-distortion circuit 410 may only adjust the pre-distortion coefficients applied to the data signal and/or the amplitude of the data signal if the difference in power between the DC rectified feedback signal and the target power is above a threshold difference level. In some aspects, the apparatus 400 may also monitor the DC rectified transmit signal and adjust the pre-distortion coefficients applied to and/or the amplitude of the data signal on a packet by packet basis.

Upon adjusting the amplitude of the data signal, the apparatus 400 may detect the new transmit power of the outgoing data signal (e.g., if it has changed) and obtain the corresponding preliminary pre-distortion coefficient from the first look-up table and corresponding amplitude and phase values from the second look-up table. The apparatus 400 may subtract the corresponding second table values from the corresponding first table value to derive a new adjusted pre-distortion coefficient and apply the adjusted pre-distortion coefficient to the outgoing data signal.

In addition, or as an alternative, the pre-distortion circuit 410 may adjust the modulation and coding scheme (MCS) used for transmitting the data signal in response to detecting a difference in power between the DC rectified feedback signal and the target power, for example, to equalize the power of the data signal to the target power.

Figure 10:
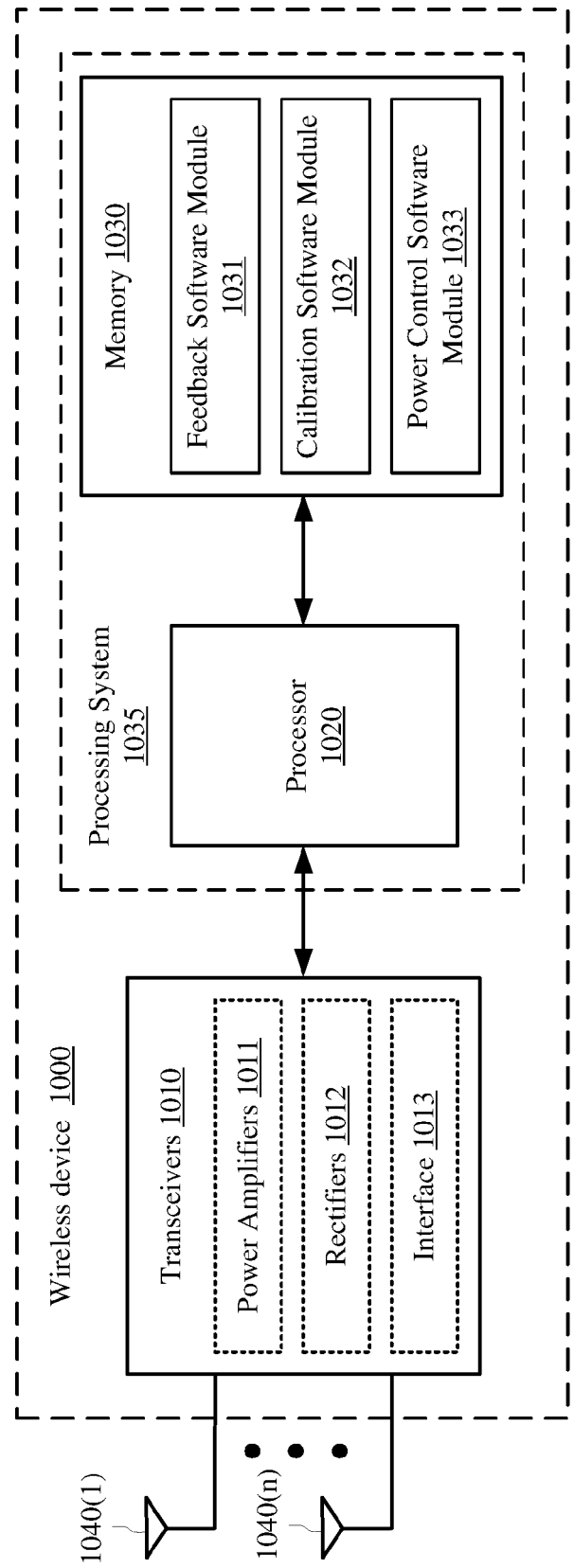
FIG. 10 shows a block diagram of a wireless device in accordance with various aspects of the present disclosure.

FIG. 10 is a block diagram of a wireless device 1000 in accordance with various aspects of the present disclosure. The wireless device 1000, which may be one implementation of the user terminals 120 of FIGS. 1-2, may include at least one of the apparatuses 400 or 600 as illustrated in FIGS. 4 and 6, respectively (not shown in FIG. 10 for simplicity). The wireless device 1000 may be implemented as an access point (AP) or a station (STA), and may include a number of transceivers 1010 coupled to a number of antennas 1040(1)-1040(n), a processor 1020, and a memory 1030. For purposes of discussion herein, the processor 1020 is shown in FIG. 10 as being coupled between the transceivers 1010 and the memory 1030. For actual embodiments, the transceivers 1010, the processor 1020, and/or the memory 1030 may be connected together using one or more buses (not shown for simplicity).

The transceivers 1010 may be coupled to the antennas 1040(1)-1040(n), either directly or through an antenna selection circuit (not shown for simplicity). The transceivers 1010 may be used to transmit signals to and receive signals from other wireless devices via the antennas 1040(1)-1040(n). The transceivers 1010 may include a number of power amplifiers 1011, a number of rectifiers 1012, and an interface 1013. The power amplifier 1011 may be one implementations of the power amplifier 420 of FIGS. 4 and 6. For example, the power amplifier 1011 may amplify outgoing signals to be transmitted, over a wireless medium, to other wireless devices. The rectifier 1012 may be one implementation of rectifier 610 of FIG. 6. For example, the rectifier 1012 may generate DC rectified feedback signals based on outgoing signals (e.g., output by the power amplifier 1011) that are to be transmitted by the wireless device 1000. The interface 1013 may be used to transmit signals to and/or receive signals from one or more other devices.

Memory 1030 may include a computer-readable medium (e.g., one or more nonvolatile memory elements, such as EPROM, EEPROM, Flash memory, a hard drive, and so on) that may store at least the following software modules:
- a feedback software module 1031 to selectively route feedback signals to the processor 1020 via a receive path of at least one of the transceivers 1010;
- a calibration software module 1032 to determine a set of pre-distortion coefficients for one or more transmit power levels based at least in part on the feedback signals; and
- a power control software module 1033 to track the power levels of outgoing signals and/or to adjust the transmission power, for example, if the power level of an outgoing signal is not within range of a transmission power threshold.

Each software module includes instructions that, when executed by the processor 1020, cause the wireless device 1000 to perform the corresponding functions. The computer-readable medium of the memory 1030 thus includes instructions for performing all or a portion of the operations described above with respect to FIGS. 7-9.

Processor 1020 may be any suitable one or more processors capable of executing scripts or instructions of one or more software programs stored in the wireless device 1000 (e.g., within memory 1030). In some aspects, processor 1020 and the instructions associated with programs stored in memory 1030 (as well as the memory 1030 itself) may be collectively referred to herein as a processing system 1035. Processor 1020 may execute the feedback software module 1031 to selectively route feedback signals to the processor 1020 via a receive path of at least one of the transceivers 1010. Processor 1020 may execute the calibration software module 1032 to determine a set of pre-distortion coefficients for one or more transmit power levels based at least in part on the feedback signals. Processor 1020 may execute the power control software module 1033 to track the power levels of outgoing signals and/or to adjust the transmission power, for example, if the power level of an outgoing signal is not within range of a transmission power threshold.

In some cases, rather than actually transmitting a frame a device may have an interface to output a frame for transmission. For example, a processor may output a frame, via a bus interface, to a radio frequency (RF) front end for transmission. Similarly, rather than actually receiving a frame, a device may have an interface to obtain a frame received from another device. For example, a processor may obtain (or receive) a frame, via a bus interface, from an RF front end for reception.

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, in some aspects, a means for selectively coupling an output of a power amplifier, provided along a transmit path of the apparatus, to a receive path of the apparatus may comprise or correspond to a switch (e.g., switch 430 of FIGS. 4 and 6). A means for outputting, on the transmit path, a first signal may comprise or correspond to a pre-distortion circuit (e.g., the pre-distortion circuit 410 of FIGS. 4 and 6). A means for outputting, on the transmit path, a second signal may comprise or correspond to a pre-distortion circuit (e.g., the pre-distortion circuit 410 of FIGS. 4 and 6). A means for outputting, on the transmit path, a fourth signal may comprise or correspond to a pre-distortion circuit (e.g., the pre-distortion circuit 410 of FIGS. 4 and 6). A means for outputting, on the transmit path, a fifth signal may comprise or correspond to a pre-distortion circuit (e.g., the pre-distortion circuit 410 of FIGS. 4 and 6).

In some aspects, a means for means for receiving, via the receive path, a first feedback signal generated based on the first signal may comprise or correspond to a pre-distortion circuit (e.g., the pre-distortion circuit 410 of FIGS. 4 and 6). A means for receiving, via the receive path, a second feedback signal generated based on the first signal may comprise or correspond to a pre-distortion circuit (e.g., the pre-distortion circuit 410 of FIGS. 4 and 6). A means for receiving, via the receive path, a fourth feedback signal generated based on the fourth signal may comprise or correspond to a pre-distortion circuit (e.g., the pre-distortion circuit 410 of FIGS. 4 and 6). A means for receiving, via the receive path, a fifth feedback signal generated based on the fifth signal may comprise or correspond to a pre-distortion circuit (e.g., the pre-distortion circuit 410 of FIGS. 4 and 6).

In some aspects, a means for determining one or more coefficients may comprise or correspond to a pre-distortion circuit (e.g., the pre-distortion circuit 410 of FIGS. 4 and 6). A means for applying the one or more coefficients to a data signal may comprise or correspond to a pre-distortion circuit (e.g., the pre-distortion circuit 410 of FIGS. 4 and 6).

In some aspects, a means for amplifying the third signal prior to being transmitted may comprise or correspond to a power amplifier (e.g., the power amplifier 420 of FIGS. 4 and 6). A second means for outputting the third signal may comprise or correspond to an interface (e.g., the interface 1013 of FIG. 10). In addition, the second means for outputting may be a transmitter or may be a bus interface, for example, to output a frame from a processor to an RF front end for transmission.

In some aspects, a means for rectifying the amplified third signal may comprise or correspond to a rectifier (e.g., the rectifier 610 of FIG. 6). A means for routing the rectified third signal may comprise or correspond to a switch (e.g., the switch 430 of FIG. 6). A means for monitoring the rectified third signal may comprise or correspond to a pre-distortion circuit (e.g., the pre-distortion circuit 410 of FIG. 6). A means for determining whether the power amplifier is approaching non-linear operation may comprise or correspond to a pre-distortion circuit (e.g., the pre-distortion circuit 410 of FIG. 6). A means for adjusting may comprise or correspond to a pre-distortion circuit (e.g., the pre-distortion circuit 410 of FIG. 6).

According to certain aspects, such means may be implemented by processing systems configured to perform the corresponding functions by implementing various algorithms (e.g., in hardware or by executing software instructions) described above for generating frames for transmission during a sector sweep procedure.

As used herein, the term "generating" encompasses a wide variety of actions. For example, "generating" may include calculating, causing, computing, creating, determining, processing, deriving, investigating, making, producing, providing, giving rise to, leading to, resulting in, looking up (e.g., looking up in a table, a database or another data structure), ascertaining and the like. Also, "generating" may include receiving (e.g., receiving information), accessing (e.g., accessing data in a memory) and the like. Also, "generating" may include resolving, selecting, choosing, establishing and the like.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like. Also, "determining" may include measuring, estimating and the like.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any such list including multiples of the same members (e.g., any lists that include aa, bb, or cc).

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, EPROM memory, EEPROM memory, registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further.

The processor may be responsible for managing the bus and general processing, including the execution of software stored on the machine-readable media. The processor may be implemented with one or more general-purpose and/or special-purpose processors. Examples include microprocessors, microcontrollers, DSP processors, and other circuitry that can execute software. Software shall be construed broadly to mean instructions, data, or any combination thereof, whether referred to as software, firmware, middleware, microcode, hardware description language, or otherwise. Machine-readable media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product. The computer-program product may comprise packaging materials.

In a hardware implementation, the machine-readable media may be part of the processing system separate from the processor. However, as those skilled in the art will readily appreciate, the machine-readable media, or any portion thereof, may be external to the processing system. By way of example, the machine-readable media may include a transmission line, a carrier wave modulated by data, and/or a computer product separate from the wireless node, all which may be accessed by the processor through the bus interface. Alternatively, or in addition, the machine-readable media, or any portion thereof, may be integrated into the processor, such as the case may be with cache and/or general register files.

The processing system may be configured as a general-purpose processing system with one or more microprocessors providing the processor functionality and external memory providing at least a portion of the machine-readable media, all linked together with other supporting circuitry through an external bus architecture. Alternatively, the processing system may be implemented with an ASIC (Application Specific Integrated Circuit) with the processor, the bus interface, the user interface in the case of an access terminal), supporting circuitry, and at least a portion of the machine-readable media integrated into a single chip, or with one or more FPGAs (Field Programmable Gate Arrays), PLDs (Programmable Logic Devices), controllers, state machines, gated logic, discrete hardware components, or any other suitable circuitry, or any combination of circuits that can perform the various functionality described throughout this disclosure. Those skilled in the art will recognize how best to implement the described functionality for the processing system depending on the particular application and the overall design constraints imposed on the overall system.

The machine-readable media may comprise a number of software modules. The software modules include instructions that, when executed by the processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

If implemented in software, the functions may be stored or transmitted over as one or more instructions or code on a computer-readable medium. Computer-readable media include both computer storage media and communication media including any medium that facilitates transfer of a computer program from one place to another. A storage medium may be any available medium that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein. For certain aspects, the computer program product may include packaging material.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. An apparatus for wireless communication, the apparatus comprising:
a power amplifier coupled to a transmit path of the apparatus;
a switch to selectively couple an output of the power amplifier to a receive path of the apparatus; and
a pre-distortion circuit coupled to an input of the power amplifier by the transmit path and coupled to the switch by the receive path, the pre-distortion circuit configured to:
if the power amplifier is on:
output, on the transmit path, a first signal; and
receive, via the receive path, a first feedback signal generated based on the first signal;
if the power amplifier is off:
output, on the transmit path, a second signal; and
receive, via the receive path, a second feedback signal generated based on the second signal;
determine one or more coefficients based at least in part on the first and second feedback signals; and
apply the one or more coefficients to a data signal to generate a third signal.

2. The apparatus of claim 1, wherein the pre-distortion circuit is to determine the one or more coefficients by:
isolating one or more characteristics of the power amplifier from parasitics of at least one of the transmit path or the receive path based on a difference between the first feedback signal and the second feedback signal.

3. The apparatus of claim 1, wherein the switch is to route the first and second feedback signals from the output of the power amplifier to the pre-distortion circuit while bypassing a low noise amplifier (LNA) coupled to the receive path.

4. The apparatus of claim 1, wherein the power amplifier is to:
amplify the third signal prior to being transmitted.

5. The apparatus of claim 4, further comprising a rectifier coupled to the transmit path and the power amplifier, the rectifier to:
rectify the amplified third signal to generate a rectified third signal; and
route the rectified third signal to the pre-distortion circuit via the receive path.

6. The apparatus of claim 5, wherein the pre-distortion circuit is further configured to:
monitor the rectified third signal;
determine whether the power amplifier is approaching non-linear operation based on the monitored third signal; and
if the power amplifier is approaching non-linear operation, adjust at least one of the one or more coefficients applied to the data signal or an amplitude of the third signal prior to being amplified by the power amplifier.

7. The apparatus of claim 1, wherein the first and second feedback signals are time-division multiplexed with received signals on the receive path.

8. The apparatus of claim 1, wherein the pre-distortion circuit is further configured to:
if the power amplifier is on:
output, on the transmit path, a fourth signal having a different power level than the first signal;
receive, via the receive path, a fourth feedback signal generated based on the fourth signal; and
determine a first set of coefficients based at least in part on the first and fourth feedback signals;
if the power amplifier is off:
output, on the transmit path, a fifth signal having a different power level than the second signal;
receive, via the receive path, a fifth feedback signal generated based on the fifth signal; and
determine a second set of coefficients based at least in part on the second and fifth feedback signals,
wherein the one or more coefficients are based on the first set of coefficients and the second set of coefficients.

9. The apparatus of claim 1, wherein the switch is to:
couple the output of the power amplifier to the receive path during a calibration mode; and
isolate the output of the power amplifier from the receive path during a normal mode.

10. The apparatus of claim 9, further comprising:
an interface configured to output the third signal for transmission in either calibration mode or normal mode.

11. A method for wireless communication, comprising:
selectively coupling an output of a power amplifier, provided along a transmit path of an apparatus, to a receive path of the apparatus;
if the power amplifier is on:
outputting, on the transmit path, a first signal; and
receiving, via the receive path, a first feedback signal generated based on the first signal;
if the power amplifier is off:
outputting, on the transmit path, a second signal; and
receiving, via the receive path, a second feedback signal generated based on the second signal;
determining one or more coefficients based at least in part on the first and second feedback signals; and applying the one or more coefficients to a data signal to generate a third signal.

12. The method of claim 11, wherein the determining comprises:
isolating one or more characteristics of the power amplifier from parasitics of at least one of the transmit path or the receive path based on a difference between the first feedback signal and the second feedback signal.

13. The method of claim 11, wherein the selectively coupling comprises:
routing the first and second feedback signals from the output of the power amplifier to the receive path while bypassing a low noise amplifier (LNA) coupled to the receive path.

14. The method of claim 11, further comprising:
amplifying the third signal prior to being transmitted.

15. The method of claim 14, further comprising rectifying the amplified third signal to generate a rectified third signal; and
routing the rectified third signal to the receive path.

16. The method of claim 15, further comprising:
monitoring the rectified third signal;
determining whether the power amplifier is approaching non-linear operation based on the monitored third signal; and
if the power amplifier is approaching non-linear operation, adjusting at least one of the one or more coefficients applied to the data signal or an amplitude of the third signal prior to being amplified by the power amplifier.

17. The method of claim 11, wherein the first and second feedback signals are time-division multiplexed with received signals on the receive path.

18. The method of claim 11, further comprising:
if the power amplifier is on:
outputting, on the transmit path, a fourth signal having a different power level than the first signal;
receiving, via the receive path, a fourth feedback signal generated based on the fourth signal; and
determining a first set of coefficients based at least in part on the first and fourth feedback signals;
if the power amplifier is off:
outputting, on the transmit path, a fifth signal having a different power level than the second signal;
receiving, via the receive path, a fifth feedback signal generated based on the fifth signal; and
determining a second set of coefficients based at least in part on the second and fifth feedback signals,
wherein the one or more coefficients are based on the first set of coefficients and the second set of coefficients.

19. The method of claim 11, further comprising:
coupling the output of the power amplifier to the receive path during a calibration mode; and
isolating the output of the power amplifier from the receive path during a normal mode.

20. The method of claim 19, further comprising:
outputting the third signal for transmission in either calibration mode or normal mode.

21. A wireless node comprising:
at least one antenna coupled to a transmit path and a receive path of the wireless node; and
a processing system configured to:
selectively couple an output of a power amplifier, provided along a transmit path of the wireless node, to a receive path of the wireless node;

if the power amplifier is on:
  output, on the transmit path, a first signal; and
  receive, via the receive path, a first feedback signal generated based on the first signal;
if the power amplifier is off:
  output, on the transmit path, a second signal; and
  receive, via the receive path, a second feedback signal generated based on the second signal;
determine one or more coefficients based at least in part on the first and second feedback signals; and
apply the one or more coefficients to a data signal to generate a third signal.

* * * * *